(12) United States Patent
Guo et al.

(10) Patent No.: US 11,088,350 B2
(45) Date of Patent: Aug. 10, 2021

(54) DISPLAY DEVICE AND METHOD FOR MANUFACTURING THE SAME

(71) Applicant: Wuhan Tianma Micro-Electronics Co., LTD., Wuhan (CN)

(72) Inventors: Linshan Guo, Wuhan (CN); Peng Shen, Wuhan (CN); Yuanyuan Rao, Wuhan (CN); Yinghua Mo, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/601,353

(22) Filed: Oct. 14, 2019

(65) Prior Publication Data

US 2020/0350512 A1 Nov. 5, 2020

(30) Foreign Application Priority Data

Apr. 30, 2019 (CN) .......................... 201910361229.0

(51) Int. Cl.
*H01L 51/52* (2006.01)
*H01L 27/32* (2006.01)
(Continued)

(52) U.S. Cl.
CPC ........ *H01L 51/5253* (2013.01); *G06F 3/0412* (2013.01); *G06F 3/0446* (2019.05);
(Continued)

(58) Field of Classification Search
CPC ............... H01L 27/323; H01L 27/3276; H01L 51/5253; H01L 33/52; H01L 33/54;
(Continued)

(56) References Cited

U.S. PATENT DOCUMENTS 9,490,450 B2 * 11/2016 Kang ...................... H01L 51/56
10,205,118 B2 * 2/2019 Kim .................... H01L 27/3262
(Continued)

FOREIGN PATENT DOCUMENTS

| CN | 107180852 A | 9/2017 |
|---|---|---|
| CN | 107665062 A | 2/2018 |
| CN | 108336023 A | 7/2018 |

OTHER PUBLICATIONS

CN First Office Action, 201910361229.0, dated Sep. 15, 2020.

*Primary Examiner* — Sardis F Azongha
(74) *Attorney, Agent, or Firm* — Alston & Bird LLP

(57) ABSTRACT

A display device and a method for manufacturing the same are provided. The display device has a display area and a non-display area and includes: a substrate; a driving circuit layer including pins located in the non-display area; a light-emitting device layer; a thin film encapsulation layer including a first inorganic encapsulation layer; a touch sensing unit including a touch insulation layer; and a protective layer. Projections of the first inorganic encapsulation layer and the protective layer onto the substrate have coincident edges and do not cover the pins; or projections of the first inorganic encapsulation layer and the touch insulation layer onto the substrate have same outlines and do not overlap with the pins.

15 Claims, 15 Drawing Sheets

(51) Int. Cl.
*G06F 3/041* (2006.01)
*G06F 3/044* (2006.01)

(52) U.S. Cl.
CPC ........ *H01L 27/323* (2013.01); *H01L 27/3276* (2013.01); *G06F 2203/04102* (2013.01); *G06F 2203/04103* (2013.01); *H01L 2227/323* (2013.01); *H01L 2251/5338* (2013.01)

(58) Field of Classification Search
CPC ..... H01L 33/56; G06F 3/0446; G06F 3/0412; G06F 3/044
See application file for complete search history.

(56) References Cited

U.S. PATENT DOCUMENTS

| | | | |
|---|---|---|---|
| 10,230,069 B2* | 3/2019 | Choi | H01L 27/323 |
| 10,505,142 B2* | 12/2019 | Oh | H01L 27/3276 |
| 2015/0034920 A1* | 2/2015 | Jang | H01L 51/5237 |
| | | | 257/40 |
| 2018/0033829 A1* | 2/2018 | Oh | G06F 3/03547 |
| 2018/0061899 A1* | 3/2018 | Oh | H01L 27/3258 |
| 2018/0212192 A1* | 7/2018 | Jin | H01L 51/524 |
| 2018/0329554 A1* | 11/2018 | Beak | H01L 27/3246 |
| 2019/0189869 A1* | 6/2019 | Xiao | H01L 33/56 |
| 2020/0006706 A1* | 1/2020 | Washio | C23C 16/308 |

* cited by examiner

DISPLAY DEVICE AND METHOD FOR MANUFACTURING THE SAME

CROSS-REFERENCE TO RELATED APPLICATIONS

The present application claims priority to Chinese Patent Application No. CN201910361229.0, filed at CNIPA on Apr. 30, 2019, the content of which is incorporated herein by reference in its entirety.

TECHNICAL FIELD

The present disclosure relates to the technical field of display technologies, and in particular, to a display device and a method for manufacturing the same.

BACKGROUND

With the rapid development of display technologies, cathode ray tube technology (CRT), plasma display technology (PDP), liquid crystal display (LCD), and the latest organic light-emitting display technology (OLED) and micro-diode display technology (Micro LED) have successively appeared.

Continuous high demands from people for better displays have moved the display technologies toward devices of narrower frame, higher contrast, higher resolution, broader spectral display, lower power consumption, higher reliability, higher integration, longer service life, thinner and lighter. At the same time, research in flexible display screen (soft screen) technology has been constantly improved and extended. Unlike the traditional flat-panel displays, a soft display screen can achieve flexibly displaying with a flexible material as the substrate, thereby creating a fantastic visual effect. A flexible display panel can be applied in various fields due to its flexibility, such as a rollable display device, a wearable device, a foldable display and the like.

In a current flexible display screen, a touch function is integrated on a thin film encapsulation layer. However, due to high integration levels, more functional film layers are added to the display devices, resulting in increased thickness and complex manufacturing process.

SUMMARY

The present disclosure provides a display device and a method for manufacturing the display device.

In an aspect, the present disclosure provides a display device, having a display area and a non-display area. The display device includes: a substrate; a driving circuit layer arranged on the substrate and including a first metal layer, the first metal layer including pins located in the non-display area; a light-emitting device layer arranged on the driving circuit layer and including: organic light-emitting diodes, each of the organic light-emitting diodes including a first electrode, a light-emitting layer and a second electrode that are disposed on the driving circuit layer; and a pixel definition layer including apertures exposing the first electrode; a thin film encapsulation layer arranged on the light-emitting device layer and including a first inorganic encapsulation layer; a touch sensing unit arranged on the thin film encapsulation layer and including: a touch insulation layer and a second touch metal layer; and a protective layer arranged on the touch sensing unit. A projection of the first inorganic encapsulation layer onto the substrate and a projection of the protective layer onto the substrate have coincident edges and do not overlap with the pins; or the projection of the first inorganic encapsulation layer onto the substrate and a projection of the touch insulation layer onto the substrate have same outlines and do not overlap with the pins.

In another aspect, the present disclosure provides a method for manufacturing a display device. The display device has a display area and a non-display area. The method includes: providing a substitute; forming a driving circuit layer on the substrate, the driving circuit layer, and the first metal layer including a first metal layer including pins disposed in the non-display area; forming a light-emitting device layer on the driving circuit layer, the light-emitting device layer including: organic light-emitting diodes, each of the organic light-emitting diodes including a first electrode, a light-emitting layer and a second electrode that are disposed on the driving circuit layer; and an electrode definition layer including apertures exposing the first electrode; forming a thin film encapsulation preparation layer on the light-emitting device layer, the thin film encapsulation preparation layer including a first inorganic preparation layer; forming a touch sensing unit on the thin film encapsulation preparation layer, the touch sensing unit including a first touch metal layer, a touch insulation layer, and a second touch metal layer; forming a protective preparation layer on the touch sensing unit; patterning the protective preparation layer to form a precursor protective layer; and patterning the first inorganic preparation layer by using the precursor protective layer as a mask to form a first inorganic encapsulation layer and a protective layer. A projection of the first inorganic encapsulation layer onto the substrate and a projection of the protective layer onto the substrate have coincident edges and do not overlap with the pins.

In still another aspect, the present disclosure provides a method for manufacturing a display device. The display device has a display area and a non-display area. The method includes: provide a substrate; forming a driving circuit layer on the substrate, the driving circuit layer including a first metal layer, and the first metal layer including pins located in the non-display area; forming a light-emitting device layer on the driving circuit layer, the light-emitting device layer including: organic light-emitting diodes, each of the organic light-emitting diodes including a first electrode, a light-emitting layer and a second electrode that are disposed on the driving circuit layer; and an electrode definition layer including apertures exposing the first electrodes; forming a thin film encapsulation preparation layer on the light-emitting device layer, the thin film encapsulation layer preparation including a first inorganic preparation layer; forming a touch insulation preparation layer on the thin film encapsulation preparation layer; patterning the touch insulation preparation layer to form a touch insulation layer; patterning the first inorganic preparation layer to form a first inorganic encapsulation layer; forming a second touch metal layer on the touch insulation layer; and forming a protective layer on the second touch metal layer. A projection of the first inorganic encapsulation layer onto the substrate and a projection of the touch insulation layer onto the substrate have same outlines and do not overlap with the pins.

DESCRIPTION OF EMBODIMENTS

Features and advantages of the present disclosure will be further described with reference to the accompanying drawings and embodiments.

It is to be noted that details are set forth in the following description to illustrate the present disclosure, however, the present disclosure can be implemented in a variety of ways, and those skilled in the art can make similar promotion without departing from the scope of the present disclosure. Therefore, the present disclosure is not limited by the embodiments disclosed in the following.

Figure 1:
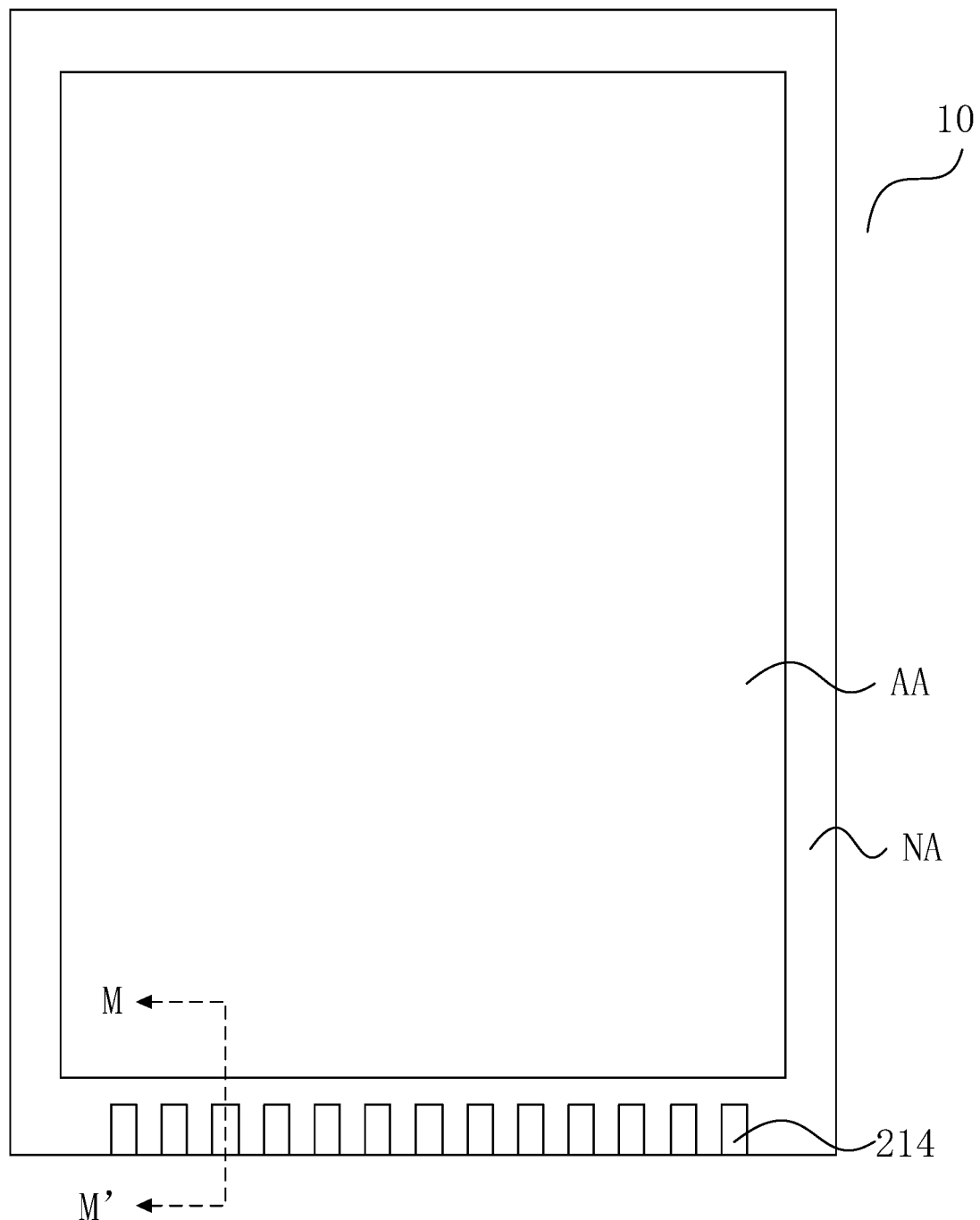
FIG. 1 is a top view of a structure of a display device according to an embodiment of the present disclosure.
Figure 2:
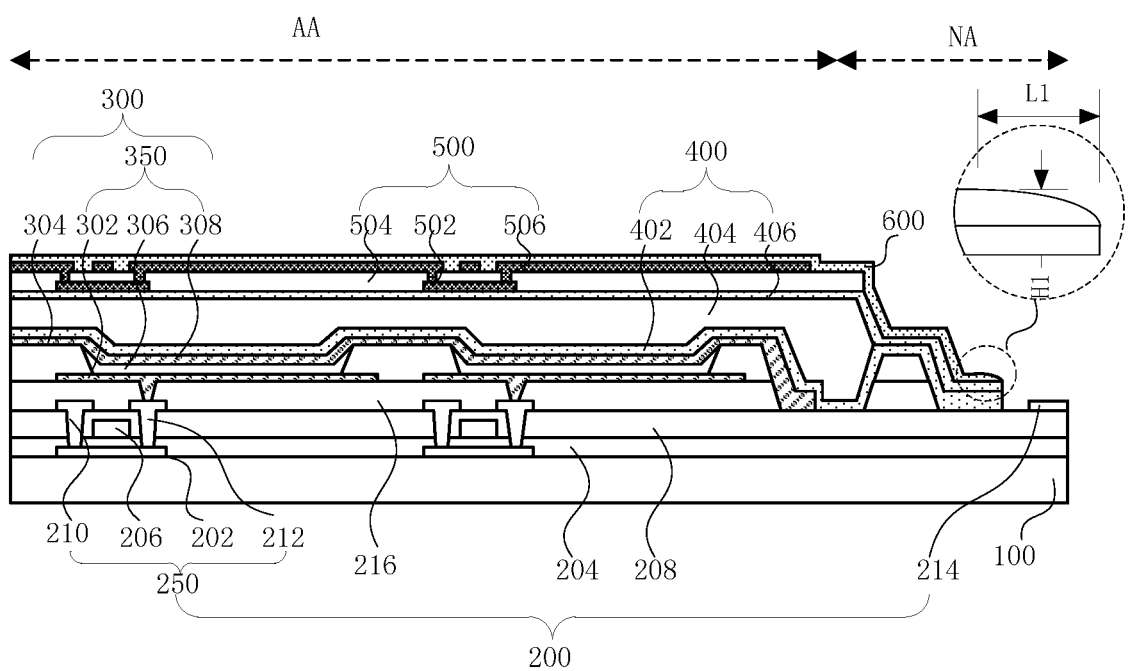
FIG. 2 is a cross-sectional view of a structure of the display device taken along MM' of FIG. 1.

FIG. 1 is a top view of a structure of a display device according to an embodiment of the present disclosure, and FIG. 2 is a cross-sectional view of a structure of the display device taken along MM' of FIG. 1. With reference to FIG. 1 and FIG. 2, the display device has a display area AA and a non-display area NA. The display area AA is located at a center of the entire display device, and the non-display area NA surrounds the display area. The display device 10 includes a substrate 100, a driving circuit layer 200, a light-emitting device layer 300, a thin film encapsulation layer 400, a touch sensing unit 500, and a protective layer 600. The driving circuit layer 200 is disposed on the substrate 100, and the driving circuit layer 200 includes a first metal layer including pins 214 located in the non-display area NA. The light-emitting device layer 300 can be disposed on the driving circuit layer 200 and include a plurality of organic light-emitting diodes. Further, the organic light-emitting diode includes a first electrode 302, a light-emitting layer 306, a second electrode 308, and a pixel definition layer 304. The pixel definition layer 304 includes an aperture that exposes the first electrode 302. The thin film encapsulation layer 400 is disposed on the light-emitting device layer 300, and includes a first inorganic encapsulation layer 402, an organic encapsulation layer 404 and a second inorganic encapsulation layer 406 that are stacked. The touch sensing unit 500 is disposed on the thin film encapsulation layer 400 and includes a first touch metal layer 502, a touch insulation layer 504 and a second touch metal layer 506. The protective layer 600 is disposed on the touch sensing unit 500. A projection of the first inorganic encapsulation layer 402 onto the substrate 100, a projection of the second inorganic encapsulation layer 406 onto the substrate 100 and a projection of the protective layer 600 onto the substrate 100 have coincident edges and do not overlap with the pins 214.

The substrate 100 can be a flexible substrate and its materials include plastic. For example, the material of substrate 100 includes polyethersulfone (PES), polyacrylate (PAR), polyetherimide (PEI), polyethylene naphthalate (PEN), polyethylene terephthalate (PET), polyphenylene sulfide (PPS), polyallyl ester, polyimide (PI), polycarbonate (PC), cellulose triacetate (TAC) or cellulose acetate propionate (CAP). However, the embodiments of the present disclosure are not limited thereto.

The display device 10 can be a bottom-emission type display device. Alternatively, display device 10 can be a top-emission type display device. When the display device 10 is a bottom-emission type display device that emits light towards a side surface of the substrate 100 facing away from the thin film encapsulation layer 400 and performs image displaying, the substrate 100 can include a transparent material. However, when the display device 10 is a top-emission type display device that displays an image towards the thin film encapsulation layer 400, the substrate 100 can include an opaque material. The substrate 100 can include a flexible opaque metal. When the substrate 100 includes a metal, the substrate 100 can include at least one material selected from metal materials such as iron, chromium, manganese, nickel, titanium, molybdenum, stainless steel (SUS), inconel and the like. However, the embodiments of the present disclosure are not limited thereto. The substrate 100 can include a metal foil.

The driving circuit layer 200 is formed on the substrate 100. The driving circuit layer includes a plurality of pixel circuits for driving the light-emitting diodes to emit light. Each pixel circuit includes at least two thin film transistors and one capacitor, for example, two thin film transistors and one capacitor (2T1C), or five thin film transistors and one capacitor (5T1C), or seven thin film transistors and one capacitor (7T1C). The at least two thin film transistors and one capacitor include a driving transistor having a drain electrode electrically connected to an anode of the organic light-emitting diode to control displaying of the organic light-emitting diode. In order to more clearly illustrate a film structure of the present disclosure, two pixels are shown in FIG. 2, and in each pixel, only one thin film transistor connected to the organic light-emitting diode is illustrated.

With reference to FIG. 2, a thin film transistor 250 is formed on the substrate 100. The thin film transistor 250 can include an active layer 202, a gate electrode 206, a source electrode 210 and a drain electrode 212.

The active layer 202 can include an inorganic semiconductor such as silicon. Alternatively, the active layer 202 can include an organic semiconductor. The active layer 202 can have a source region, a drain region, and a channel region. The channel region can be disposed between the source region and the drain region. In an example, when the active layer 202 includes polysilicon, an amorphous silicon layer can be first formed on substantially an entire surface of the substrate 100, and then the resulting structure can be crystallized to form a polysilicon layer. The polysilicon layer can be patterned. The source region and drain region can be doped with impurities, and the source region and drain region can be doped with impurities at an edge of the polysilicon layer, thereby forming an active layer 202 having a source region, a drain region and a channel region disposed between the source region and the drain region.

A gate insulation layer 204 is formed on the active layer 202. The gate insulation layer 204 is configured to insulate the gate electrode 206 from the active layer 202. The gate insulating layer 204 can include an inorganic material such as $SiN_x$ or $SiO_2$, and it should be noted that the embodiments of the present disclosure are not limited thereto.

The gate electrode 206 is formed on a predetermined region on the gate insulation layer 204. The gate electrode 206 can be connected to a gate line. The gate line can transmit a gate driving signal to the thin film transistor 250. The gate electrode 206 can include Au, Ag, Cu, Ni, Pt, Pd, Al or Mo, or include an alloy such as an Al—Nd alloy or a Mo—W alloy. However, the embodiments of the present disclosure are not limited thereto. The gate electrode 206 can include various other materials as required. Moreover, in an embodiment of the present disclosure, the metal in the same layer as the gate electrode can further include other elements such as a signal driving line located in the non-display area, a light-emitting signal line located in the display area and the like.

An interlayer insulation layer 208 is formed on the gate electrode 206. The interlayer insulation layer 208 can insulate the gate electrode 206 from the source electrode 210 and the drain electrode 212. The interlayer insulation layer 208 can include an inorganic material such as $SiN_x$ or $SiO_2$, and the embodiments of the present disclosure are not limited thereto.

The source electrode 210 and the drain electrode 212 can be formed on the interlayer insulation layer 208. The interlayer insulation layer 208 and the gate insulation layer 204 include a through hole that exposes the source region and the drain region of the active layer 202. The source electrode 210 and the drain electrode 212 can be in direct contact with the source region and the drain region of the active layer 202 that are exposed via the through hole.

The source electrode 210 and the drain electrode 212 can include at least one or more materials selected from Al, Pt, Pd, Ag, Mg, Au, Ni, Nd, Ir, Cr, Li, Ca, Mo, Ti, W, and Cu. The source electrode 210 and the drain electrode 212 can have a single layer structure or a multilayer structure. Moreover, in an embodiment of the present disclosure, the metal in the same layer as the source electrode and the drain electrode can further include other elements such as the pin 214 located in the non-display area, a signal line and a power signal line located in the display area and the like. The pin 214 can be electrically connected to the data line or other signal line, to transmit a signal from an external driving circuit to the data line. The data line is electrically connected to the drain electrode, thereby transmitting a driving signal from outside to the thin film transistor 250. In this embodiment, the metal layer is referred to as a first metal layer.

FIG. 2 shows a top gate type thin film transistor, which sequentially includes an active layer 202, a gate electrode 206, a source electrode 210 and a drain electrode 212. However, the embodiments of the present disclosure are not limited thereto. For example, the gate electrode can be disposed under the active layer.

The thin film transistor 250 can be electrically connected to the organic light-emitting diode 350. The thin film transistor 250 transmits a signal to the organic light-emitting diode 350, and the signal can be used to drive the organic light-emitting device to perform displaying. The thin film transistor 250 can be covered by a planarization layer 216, which can protect the thin film transistor 250 from external interference and can achieve that the driving circuit layer has a flat surface, thereby facilitating the subsequent preparation of the device.

The planarization layer 216 can include an inorganic insulation layer and/or an organic insulation layer. The inorganic insulation layer can include $SiO_2$, $SiN_x$, SiON, $Al_2O_3$, $TiO_2$, $Ta_2O_5$, $HfO_2$, $ZrO_2$ or Barium Strontium Titanate (BST), however, the embodiments of the present disclosure are not limited thereto. When the planarization layer includes an organic insulation layer, the organic insulation layer can include polymethyl methacrylate (PMMA), polystyrene (PS), phenol-based polymeric derivative, acrolein-based polymer, imide-based polymer, aryl ether-based polymer, amido polymer, fluorine-based polymer, p-xylylene polymer, vinyl alcohol-based polymer, or any combination thereof, however, the embodiments of the present disclosure are not limited thereto. The planarization layer 216 can have a composite stacking structure, and the composite stacking structure can include an inorganic insulation layer and/or an organic insulation layer.

In some other embodiments of the present disclosure, a first buffer layer can be further disposed between the substrate 100 and the driving circuit layer 200. The first buffer layer can reduce impurities that would enter the driving circuit layer 200 after penetrating the substrate 100. Moreover, the first buffer layer can entirely cover the substrate 100 to form a flat surface. Therefore, the first buffer layer can include a material capable of forming a flat surface. For example, the first buffer layer can include an inorganic material such as silicon oxide, silicon nitride, silicon oxynitride, aluminum oxide, aluminum nitride, titanium oxide or titanium nitride. The first buffer layer can also include an organic material such as polyimide, polyester or acrylic acid. The first buffer layer can have a single layer structure or a multilayer structure. When the first buffer layer is of a multilayer structure, the multilayer structure can be selected from any combination of the above-mentioned inorganic materials or organic materials.

The light-emitting device layer 300 can be formed on the planarization layer 216, i.e., on the driving circuit layer 200. The light-emitting device layer includes a plurality of organic light-emitting diodes 350 and a pixel definition layer 304. The organic light-emitting diode 350 includes a first electrode 302, a light-emitting layer 306 and a second electrode 308.

The first electrode 302 is formed on the planarization layer 216 and is electrically connected to the drain electrode 212 via the through hole in the planarization layer 216 that exposes a portion of the drain electrode 212. The first electrode 302 can be a reflective electrode, a transmissive electrode or a semi-transmissive electrode. When the first electrode 302 is a reflective electrode, the first electrode 302 can include a reflective layer including Ag, Mg, Al, Pt, Pd, Au, Ni, Nd, Ir, Cr, or any combination thereof, however, the embodiments of the present disclosure are not limited thereto. When the first electrode 302 is a transmissive electrode or a semi-transmissive electrode, the first electrode 302 can include a transmissive electrode layer or a semi-transmissive electrode layer. The transmissive electrode layer or the semi-transmissive electrode layer can include indium tin oxide (ITO), indium zinc oxide (IZO), zinc oxide (ZnO), indium oxide ($In_2O_3$), indium gallium oxide (IGO) or aluminum zinc oxide (AZO), however, the embodiments of the present disclosure are not limited thereto.

The light-emitting layer 306 includes an organic material with a low molecular weight or an organic material with a high molecular weight. Moreover, the light-emitting layer 306 can include at least one layer of a hole transport layer (HTL), a hole injection layer (HIL), an electron transport layer (ETL), and an electron injection layer (EIL). In the display device 10, the display area AA is provided with a plurality of first electrodes 302 arranged in an array, and each first electrode 302 corresponds to one light-emitting pixel. The pixel definition layer 304 covers a gap between adjacent first electrodes 302 and partially covers edges of the first electrodes 302 and includes a plurality of apertures exposing the first electrodes 302. The light-emitting layer 306 is formed aligned to each aperture formed in the pixel definition layer 304.

The second electrode 308 can be a transmissive electrode or a semi-transmissive electrode, and the second electrode 308 covers a plurality of light-emitting layers 306 and the definition layer 304. The second electrode 308 can include a metal thin film, and the metal thin film can include Li, Ca, LiF/Ca, LiF/Al, Al, Ag, Mg or a compound thereof, which can have a relatively low work function. An auxiliary electrode layer or a bus electrode can be further formed on the metal thin film, and the auxiliary electrode layer or the bus electrode can include a material for forming the transmissive electrode, such as ITO, IZO, ZnO or $In_2O_3$, however, the embodiments of the present disclosure are not limited thereto.

Light emitted from the light-emitting layer 306 can be transmitted through the second electrode 308. In this case, the display device 10 is a top-emission type display device. It should be noted that the display device 10 can also be a bottom-emission type display device, and light emitted from the light-emitting layer can be transmitted towards the substrate 100. In this case, the first electrode 302 can include a transmissive electrode or a semi-transmissive electrode, and the second electrode 308 includes a reflective electrode.

The pixel definition layer 304 includes an insulation material, and the pixel definition layer 304 is disposed on the first electrode 302. The pixel definition layer 304 can include at least one organic insulation material including polyimide, polyamide, acrylic resin, benzocyclobutene or phenol resin, however, the embodiments of the present disclosure are not limited thereto. The pixel definition layer 304 can be formed by spin coating and patterning, and the pixel definition layer 304 can expose a predetermined region of the first electrode 302.

The thin film encapsulation layer 400 is formed on the second electrode 308, and the thin film encapsulation layer 400 can include a first inorganic encapsulation layer 402, an organic encapsulation layer 404 and a second inorganic encapsulation layer 406 that are stacked. The thin film encapsulation layer 400 can substantially cover the entire light-emitting device layer 200 and the entire driving circuit layer 100 and expose some necessary connection pins such as a data line pin, a driving signal pin and the like. The thin film encapsulation layer 400 can reduce or eliminate water and oxygen that would permeate the light-emitting device layer 300 from outside. The thin film encapsulation layer 400 has a greater area than the light-emitting emitting device layer 300. Therefore, an edge of the thin film encapsulation layer 400 can be in direct contact with the substrate 100 and cover an edge of the light-emitting device layer 300, thereby reducing or eliminating permeating of water and oxygen from the outside air.

In this embodiment, the thin film encapsulation layer can include three encapsulation layers, i.e., the first inorganic encapsulation layer 402, the organic encapsulation layer 404, and the second inorganic encapsulation layer 406. In other embodiments of the present disclosure, the thin film encapsulation layer can include n encapsulation layers, where n is an integer that is larger than or equal to 1. The n encapsulation layers can each include an organic layer and an inorganic layer. The organic layer and the inorganic layer can be sequentially stacked on the light-emitting device layer 300.

The first inorganic encapsulation layer 402 and the second inorganic encapsulation layer 406 can include nitride, oxide, oxynitride, nitrate, carbide, or any combination thereof. For example, the first inorganic encapsulation layer 402 and the second inorganic encapsulation layer 406 can include silicon nitride, aluminum nitride, zirconium nitride, titanium nitride, hafnium nitride, tantalum nitride, silicon oxide, aluminum oxide, titanium oxide, tin oxide, cerium oxide, silicon nitrate, silicon oxynitride or any combination thereof.

The organic encapsulation layer 404 includes, but is not limited to, acrylic fibers, hexamethyldisiloxane, polyacrylates, polycarbonates, polystyrene and the like for buffering stress of the device during bending and folding and for coverage of particulate contaminants. The organic encapsulation layer 404 can be formed by printing, and to avoid flowing during printing of the organic encapsulation layer, which would otherwise result in an uncontrollable area, a printing area can be slightly smaller than an area of the first inorganic encapsulation layer and smaller than an area the second inorganic encapsulation layer. The first inorganic encapsulation layer 402 and the second inorganic encapsulation layer 406 can each have an area that is larger than the area of the organic encapsulation layer 404. Therefore, the first inorganic encapsulation layer 402 can be in direct contact with the second inorganic encapsulation layer 406 at their outer edges. The inorganic encapsulation layer has a main function of permeating water and oxygen, and the organic encapsulation layer has a main function of absorption of stress and coverage of contaminated particles. Therefore, a structure in which the organic encapsulation layer is completely encapsulated by the inorganic encapsulation layer can further improve an encapsulation effect from a side of the display device 10, thereby reducing or eliminating permeating of oxygen or water from outside.

Further, the organic encapsulation layer 404 is formed by inkjet printing. Therefore, a dam structure can be formed at a periphery of the display area to delimit an outer edge of the organic encapsulation layer 404. The dam structure can be formed by a material that is in the same layer as the planarization layer 216 and/or the pixel definition layer 304, and can also include a material in other film layer. It should be noted that in other embodiments of the present disclosure, the dam structure is not necessary, and an edge range of the organic encapsulation layer can be controlled by controlling a concentration of a printed material, a position of a nozzle and the like during the inkjet printing process.

The first inorganic encapsulation layer 402 and the second inorganic encapsulation layer 406 each can have a thickness of approximately 30 nm to approximately 500 nm. In this embodiment, the first inorganic encapsulation layer 402 and the second inorganic encapsulation layer 406 can be formed by first forming a material layer and then performing thinning. In this thickness range, the better encapsulation performance and water and oxygen barrier properties can be achieved while achieving the encapsulation performance. Moreover, the inorganic encapsulation layer after thinning can be more advantageous to improve a bending performance. However, the embodiments of the present disclosure are not limited thereto. The first inorganic encapsulation layer 402 and the second inorganic encapsulation layer 406 can also be formed, as in the related art, by directly forming an inorganic layer without performing thinning.

The organic encapsulation layer 404 can flatten a height difference. In the film layer under the thin film encapsulation layer 400, the pixel definition layer 304 creates a height difference while forming different pixel apertures, and the organic encapsulation layer 404 can flatten the height difference. The organic encapsulation layer 404 can also reduce stress generated by the first inorganic encapsulation layer 402 and the second inorganic encapsulation layer 406. In a process of manufacturing the display device, after the first inorganic encapsulation layer, there may be residual impurity particles existing. In this case, the organic encapsulation layer 404 can cover the residual impurities to achieve flattening, thereby preventing residual impurities from affecting the encapsulation performance.

The thickness of the organic encapsulation layer 404 can be within a range from approximately 1 μm to approximately 8 μm. When the thickness of the organic encapsulation layer 404 is within this range, the film layer under the organic encapsulation layer 404 can be sufficiently flattened.

In other embodiments of the present disclosure, when two or more organic encapsulation layers are provided, the at least two organic layers can have substantially same or different thicknesses.

According to an embodiment of the present disclosure, the organic encapsulation layer 404 can be thicker than the first inorganic encapsulation layer 402 and the second inorganic encapsulation layer 406, respectively.

Figure 24:
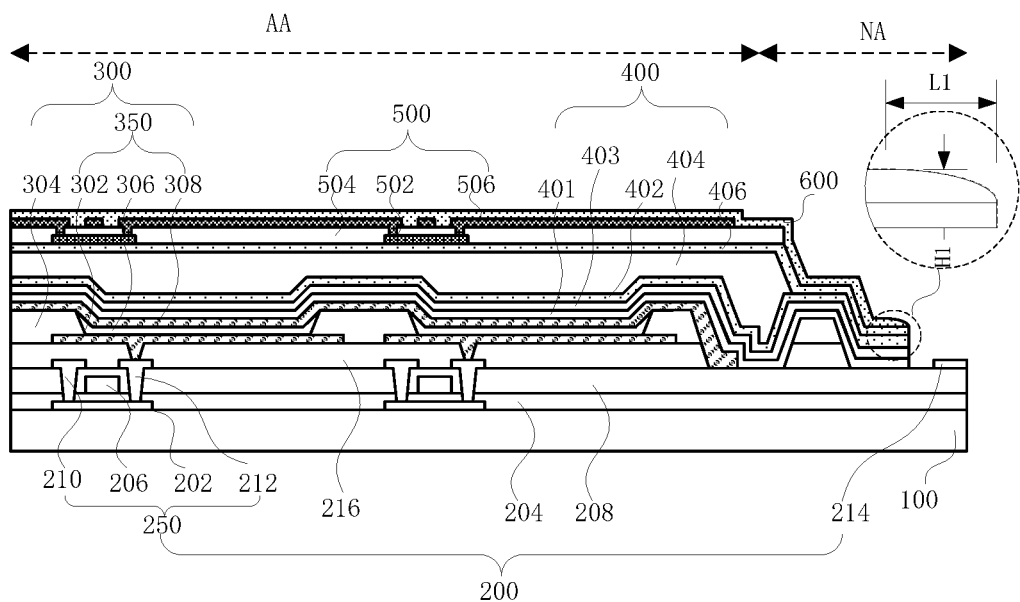
FIG. 24 is a schematic cross-sectional view of another structure of the display device taken along MM' of FIG. 1.

In some other embodiments of the present disclosure, a second buffer layer 401 (As shown in FIG. 24) can also be disposed between the light-emitting device layer 300 and the first inorganic encapsulation layer 402. The second buffer layer 401 can reduce impurities that would permeate the light-emitting device layer 300 after penetrating the first inorganic encapsulation layer 402. The second buffer layer 401 can include a material capable of forming a flat surface. For example, the second buffer layer can include an inorganic material such as silicon oxide, silicon nitride, silicon oxynitride, aluminum oxide, aluminum nitride, titanium oxide or titanium nitride. The second buffer layer can also include an organic material such as polyimide, polyester or acrylic acid. The second buffer layer can be of a single layer structure or a multilayer structure. When the second buffer layer is of a multilayer structure, the multilayer structure can be selected from any combination of the above-mentioned inorganic materials or organic materials. The second buffer layer can be formed by using the same material and process as those of the first inorganic encapsulation layer 402, that is, an entire surface of the second buffer preparation layer is formed and then thinned, and details thereof will not be further described herein. The second buffer layer after thinning can have a thickness in range of 30 nm to 300 nm.

In some other embodiments of the present disclosure, an atomic layer deposited layer 403 (as shown in FIG. 24) is deposited by atomic layer deposition (ALD) can be further provided between the second buffer layer and the first inorganic encapsulation layer. A material, in a monoatomic film form, is plated one by one on a surface of the substrate i.e., on the second buffer layer, by an atomic layer deposition technique. When forming the atomic layer deposited layer, an oxide dielectric layer such as $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O_3$, $SrTiO_3$ and $BaTiO_3$ can be adopted. A chemical reaction of a new atomic film is directly associated with a previous layer during an atomic layer deposition process, and therefore, when the finally formed display device includes an atomic layer deposited layer, the second buffer layer is preferably LiF, so as to be matched with a lattice of the atomic layer deposited layer.

In some other embodiments of the present disclosure, the thin film encapsulation layer can only include the second buffer layer 401, the atomic layer deposited layer 403 and the first inorganic encapsulation layer 402, without the organic encapsulation layer and the second inorganic encapsulation layer. Since the organic encapsulation layer is not included, a thickness of the entire display device can be greatly reduced.

Figure 3:
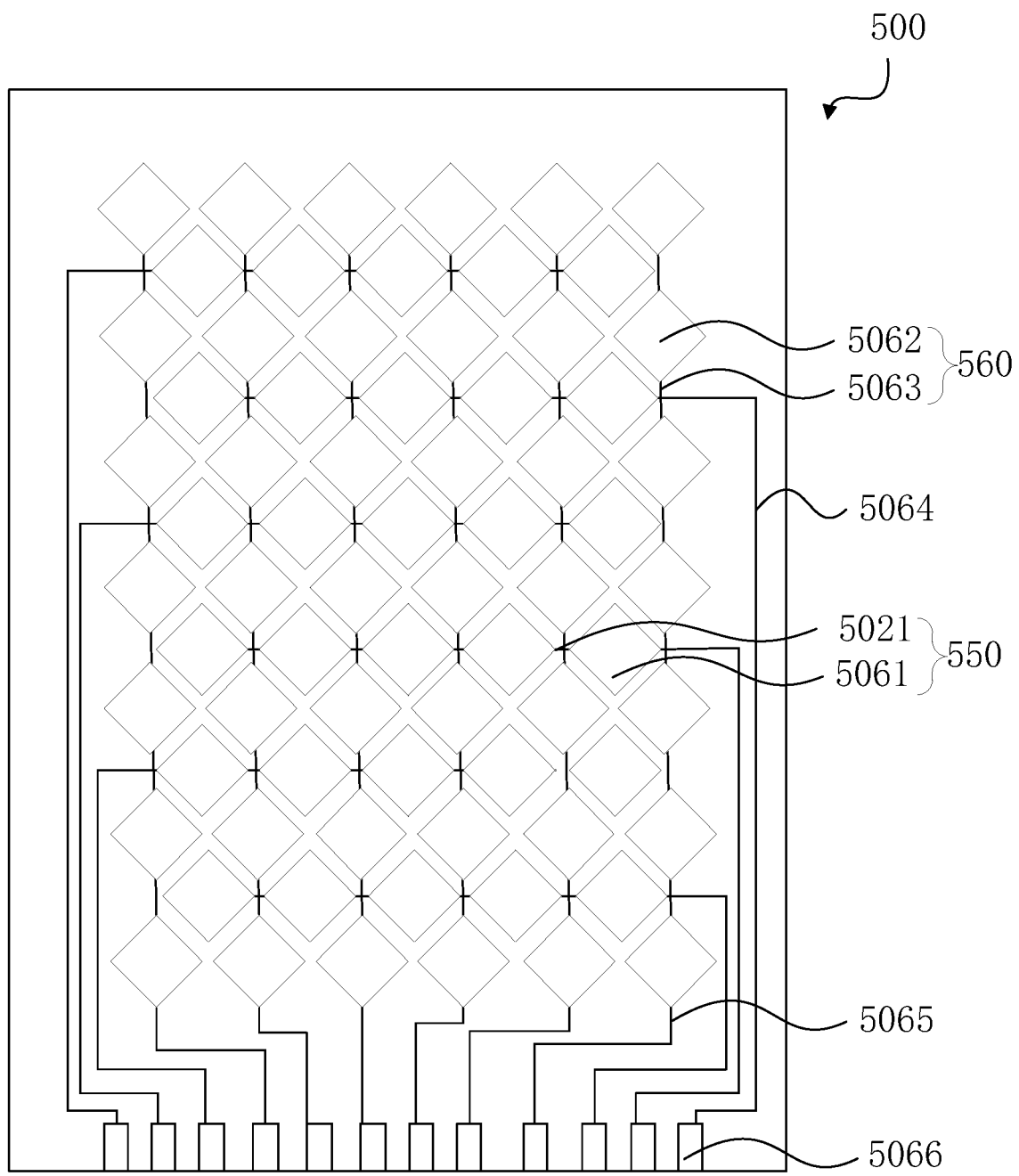
FIG. 3 is a top view of a structure of a touch sensing unit according to an embodiment of the present disclosure.

The touch sensing unit 500 is formed on the thin film encapsulation layer 400. The touch sensing unit 500 can be an electrostatic capacitance type touch screen. FIG. 3 is a top view of a structure of a touch sensing unit according to an embodiment of the present disclosure. With reference to FIG. 2 and FIG. 3, the touch sensing unit 500 includes touch transmitting electrodes 550 (or referred to as first touch electrodes) and touch sensing electrodes 560 (or referred to as second touch electrodes), and the touch transmitting electrodes 550 and the touch sensing electrodes 560 intersect with each other in an insulation manner. When a finger touches the touch sensing unit, an electrostatic capacitance between the touch transmitting electrode 550 and the touch sensing electrode 560 at the touch position can change. When a change of the electrostatic capacitance is detected, the touch position can be calculated. The touch sensing unit will be described in more details as follows with reference to FIGS. 2-4 according to an embodiment of the present disclosure. Here, FIG. 4 is an enlarged view of a portion of a structure of the touch sensing unit of FIG. 3.

Figure 4:
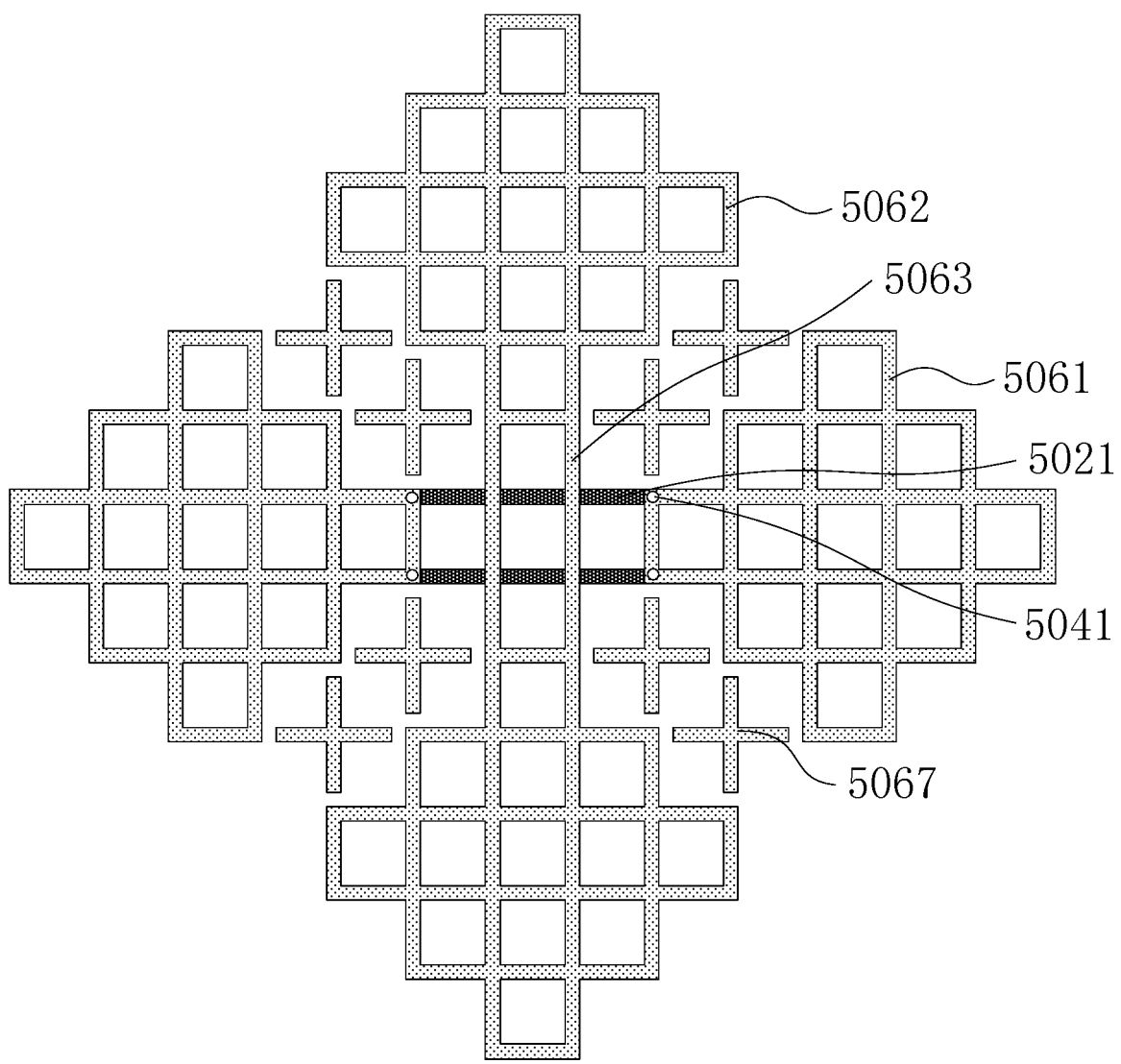
FIG. 4 is an enlarged view of a portion of a structure of the touch sensing unit of FIG. 3.

With reference to FIGS. 2-4, the touch sensing unit includes a first touch metal layer 502, and the first touch metal layer 502 includes a plurality of first connecting portions 5021. The touch sensing unit 500 further includes a second touch metal layer 506, and the second touch metal layer 506 includes a plurality of first touch electrode blocks 5061, a plurality of second touch electrode blocks 5062, a plurality of second connection portions 5063, a plurality of first touch leading wires 5064, a plurality of second touch leading wires 5065, a plurality of touch pins 5066, and a plurality of redundant electrodes 5067. A touch insulation layer 504 is further provided between the first touch metal layer 502 and the second touch metal layer 506. The touch insulation layer 504 is provided with a plurality of first through holes 5041 that expose a portion of the plurality of first connection portions 5021.

The plurality of first touch electrode blocks 5061 arranged in a first direction is electrically connected to the first connection portions 5021 via the first through holes 5041 to form the touch transmitting electrode 550. The plurality of touch transmitting electrodes extends in the first direction and is arranged in a second direction. The plurality of second touch electrode blocks 5062 arranged in the second direction is electrically connected to each other by the second connection portions 5063 that are in the same layer as the second touch electrode blocks, so as to form the touch sensing electrode 560. The plurality of touch sensing electrodes extends in the second direction and is arranged in the first direction. The touch transmitting electrode 550 is connected to the touch pin through the first touch leading wire 5064, and the touch sensing electrode 560 is connected to the touch pin 5066 through the second touch leading wire 5065. The touch pins 5066 are located in the second touch metal layer 506. The touch pins 5066 can be located in a different region from a region where the pins 214 in the first metal layer are located, so as to be electrically connected to a different flexible printed circuit board or connected to a different region on a same flexible printed circuit board.

The first touch electrode blocks 5061 and the second touch electrode blocks 5062 are in a grid structure, and the grid structure corresponds to the pixel definition layer 304. In other words, in a direction perpendicular to the substrate 100, grid metal wires of the first touch electrode blocks 5061 and the second touch electrode blocks 5062 are located within a projection of the pixel definition layer. Hollow regions of the metal grid can expose the organic light-emitting layer, so that the metal grid does not obscure displaying.

The touch transmitting electrode 550 and the touch sensing electrode 560 are electrically insulated from each other. According to an exemplary embodiment of the present disclosure, an extending direction of the touch transmissive electrode 550 is substantially perpendicular to an extending direction of the touch sensing electrode 560.

A redundant electrode 5067 can be further provided between the touch transmitting electrode 550 and the touch sensing electrode 560 that are adjacent to each other. The redundant electrode is also in a metal wire structure or a grid structure, and a position of the redundant electrode 5067 corresponds to the pixel definition layer 304. That is, in the direction perpendicular to the substrate 100, grid metal wires of the redundant electrode 5067 are located within the projection of the pixel definition layer.

The first touch electrode block 5061, the second touch electrode block 5062, and the redundant electrode each include a plurality of metal wires, and the metal wires can be made of at least one of copper, aluminum, molybdenum and silver, which can have a relatively high conductivity. When the first touch electrode block 5061 and the second touch electrode block 5062 are formed in a grid pattern, a flexibility of the touch transmitting electrode 550 and the touch sensing electrode 560 can be improved. Therefore, when the touch sensing unit 500 is bent to have a relatively small curvature, breakage of the touch transmitting electrodes 550 and the touch sensing electrodes 560 can be reduced or eliminated.

Due to the grid pattern, the plurality of touch transmitting electrodes 550 and the plurality of touch sensing electrodes 560 can have a relatively high light transmittance. The metal can have a relatively high conductivity compared to the plurality of touch transmitting electrodes 550 and the touch sensing electrodes 560 being e.g., transmissive electrodes of ITO. Therefore, a change of the electrostatic capacitance can be transferred to the driving circuit quickly, which can increase a response speed of the touch sensing unit 500.

A touch insulation layer 504 is provided between the first touch metal layer 502 and the second touch metal layer 506, and the touch insulation layer is provided with a first through hole 5041 that exposes a part of the first connection portion 5021. The first connection portion 5021 is electrically connected to the first touch electrode block 5061 via the first through hole 5041. The touch insulation layer can be made of an inorganic material, including at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, however, the embodiments of the present disclosure are not limited thereto.

In some embodiments of the present disclosure, the first touch metal layer can be located at a side of the touch insulation layer facing towards the substrate 100. In other embodiments of the present disclosure, the first touch metal layer can also be located on a surface at a side of the touch insulation layer facing away from the substrate 100. That is, in other embodiments of the present disclosure, the first touch electrode blocks 5061, the plurality of second touch electrode blocks 5062, the plurality of second connection portions 5063, the plurality of first touch leading wires 5064, the plurality of second touch leading wires 5065, the plurality of touch pins 5066 and the plurality of redundant electrodes 5067 are located at a side of the touch insulation layer facing towards the substrate 100, and only the first connection portions 5021 are located at a side of the touch insulation layer 504 facing away from the substrate 100. In still other embodiments of the present disclosure, the first touch electrode blocks and the first connection portions can be located at one side of the touch insulation layer, and the second touch electrode blocks and the second connection portions are located at the other side of the touch insulation layer. In this case, the first touch electrode block can be directly connected to the first connection portion, and the second touch electrode block can be directly connected to the second connection portion, in which the through hole in the touch insulation layer can be omitted.

In some other embodiments of the present disclosure, a third buffer layer can be provided between the thin film encapsulation layer 400 and the touch sensing unit 500. The third buffer layer can be formed directly on the second inorganic encapsulation layer 406 of the thin film encapsulation layer 400 and replace an adhesion layer between a touch substrate and a display substrate in the related art, thereby reducing a thickness of the display device 10. The third buffer layer can include a material capable of forming a flat surface. For example, the third buffer layer can include an inorganic material such as silicon oxide, silicon nitride, silicon oxynitride, aluminum oxide, aluminum nitride, titanium oxide or titanium nitride. The third buffer layer can also include an organic material such as polyimide, polyester or acrylic acid. Moreover, the third buffer layer can be of a single layer structure or a multilayer structure. When the third buffer layer is of a multilayer structure, the multilayer structure can be selected from any combination of the above-mentioned inorganic materials or organic materials. The third buffer layer can be formed directly on the thin film encapsulation layer by vapor deposition.

A protective layer 600 is further provided on the touch sensing unit, and the protective layer 600 covers the touch sensing unit 500. In this way, it can prevent the touch transmitting electrodes 550, the touch sensing electrodes 560 the first touch leading wires and the second touch leading wires from being exposed to the outside. The protective layer 600 can include an organic material or an inorganic material. When the protective layer is made of an inorganic material, the inorganic material can include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, however, the embodiments of the present disclosure are not limited thereto. When the protective layer is made of an organic material, the organic material can include at least one of acrylic resin, methacrylic resin, polyisoprene, vinyl resin, epoxy resin, carbamate resin, polydimethylsiloxane, polyimide, acrylate, polyethylene terephthalate, polyethylene naphthalate and cellulose resin. However, the embodiments of the present disclosure are not limited thereto.

In this embodiment, a projection of the first inorganic encapsulation layer 402 onto the substrate 100, a projection of the second inorganic encapsulation layer 406 onto the substrate 100 and a projection of the protective layer 600 onto the substrate 100 have coincident edges and do not cover the pins 214.

Therefore, in this embodiment, the first inorganic encapsulation layer 402 can be formed as a whole layer, and a first inorganic preparation layer formed as a whole layer covers an entire surface of the display device 10, i.e., covering the pins 214. After the first inorganic preparation layer is formed as a whole layer, an organic encapsulation layer is formed by inkjet printing, and after the organic encapsulation layer 404 is formed, a second inorganic preparation layer is formed as a whole layer. Similar to the first inorganic preparation layer, the second inorganic preparation layer also covers the entire surface of the display device 10, i.e., covering the pins 214. In this case, the pins 214 are covered by the first inorganic preparation layer and the second inorganic preparation layer. After the second inorganic preparation layer is formed, the touch sensing unit 500 is formed. When the first touch metal layer, the touch insulation layer and the second touch metal layer in the touch sensing unit 500 are patterned, the pins 214 will not be affected by an etching liquid due to protection by the first inorganic preparation layer and the second inorganic preparation layer. When forming the protective layer 600, a protective preparation layer can be first formed on the display device 10, and then the protective preparation layer is patterned to form the final protective layer 600. A projection of protective layer 600 onto the substrate 100 does not cover the pins 214. After the protective layer 600 is formed, the first inorganic preparation layer and the second inorganic preparation layer can be patterned by using the protective layer 600 as a mask, so as to form the patterned first inorganic encapsulation layer 402 and second inorganic encapsulation layer 406. Since the first inorganic encapsulation layer 402 and the second inorganic encapsulation layer 406 are formed by using the protective layer 600 as a mask during the patterning process, a projection of the first inorganic encapsulation layer 402 onto the substrate 100, a projection of the second inorganic encapsulation layer 406 onto the substrate 100 and a projection of the protective layer 600 onto the substrate 100 have coincident edges and do not cover the pins 214, thereby ensuring normal connection between the pins and a driving module.

For the display device provided by this embodiment, the first inorganic encapsulation layer 402 and the second inorganic encapsulation layer 406 are formed by using the protective layer 600 as a mask during the patterning process, that is, the three layers adopt a same mask. Therefore, compared with the related art in which different insulation layers use different masks, this embodiment can save masks and the etching process, thereby greatly improving the production efficiency and saving the cost.

In some other embodiments of the present disclosure, if the display device includes the second buffer layer, the atomic layer deposited layer and/or the third buffer layer, further, when forming the second buffer layer, the atomic layer deposited layer and/or the third buffer layer, a second buffer preparation layer, an atomic layer deposition preparation layer and/or a third buffer preparation layer can be first formed, and then the second buffer preparation layer, the atomic layer deposition preparation layer and/or the third buffer preparation layer are simultaneously patterned when finally patterning the first inorganic preparation layer and the second inorganic preparation layer. At this time, projections of the second buffer preparation layer, the atomic layer deposition preparation layer, and/or the third buffer preparation layer and the first inorganic encapsulation layer 402, the second inorganic encapsulation layer 406 and the protective layer 600 onto the substrate 100 have coincident edges.

In some other embodiments of the present disclosure, the thin film encapsulation layer includes the second buffer layer, the atomic layer deposited layer and the first inorganic encapsulation layer, and does not include the organic encapsulation layer and the second inorganic encapsulation layer. In this case, the second buffer preparation layer, the atomic layer deposition preparation layer and the first inorganic preparation layer can be simultaneously patterned by finally using the protective layer 600 as a mask, and then projections of the finally formed second buffer layer, atomic layer deposited layer and first inorganic encapsulation layer onto the substrate 100 have coincident edges.

In a process of forming the protective layer 600, a protective preparation layer can be first formed by a low temperature chemical vapor deposition (LT-CVD) technique, and the protective preparation layer can include an inorganic material or an organic material. After the protective preparation layer is formed, the protective preparation layer is patterned. Then, the first inorganic preparation layer and the second inorganic preparation layer are patterned by dry etching. During the patterning of the first inorganic preparation layer and the second inorganic preparation layer, since etching gas has an etching effect on the protective layer and etches the entire protective layer, the protective layer can be thinned by the etching gas. The protective layer after the thinning has a thickness of 50 nm-300 nm. Moreover, since an edge area and a central area have different etching rates during the etching process, the thickness of the finally formed protective layer gradually increases from the edge area towards the central area. Further, the protective layer can include an arc slope portion having a length L1 and a maximum height H1, where $300 \leq L1/H1 \leq 600$. Within this range, the slope has a relatively smooth transition and can provide good protection and stress dispersion.

In some embodiments of the present disclosure, with further reference to FIG. 2, when the display device includes a dam structure, the organic encapsulation layer ends at the dam structure, and the first inorganic encapsulation layer 402, the second inorganic encapsulation layer 406 and the protective layer 600 each end at a position between the dam structure and the pin 214. With this structure, the first inorganic encapsulation layer 402 and the second inorganic encapsulation layer 406 have curved and extended surfaces due to the dam structure, which is equivalent to increasing the encapsulation area, thereby better preventing water and oxygen.

Figure 5:
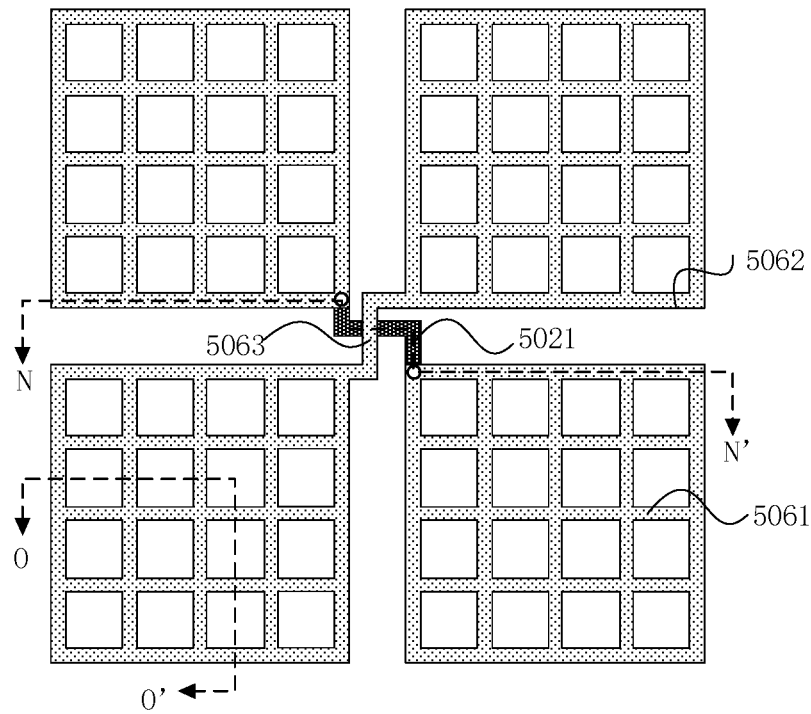
FIG. 5 is a top view of a structure of another touch sensing unit according to an embodiment of the present disclosure.
Figure 6:
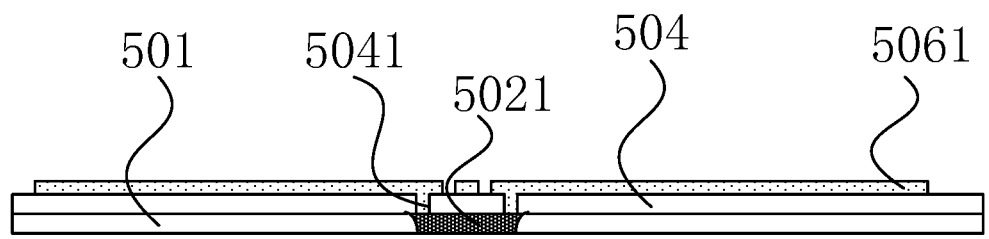
FIG. 6 is a cross-sectional view of a structure taken along NN' of FIG. 5.
Figure 7:
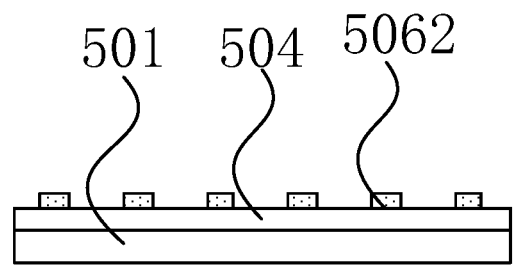
FIG. 7 is a cross-sectional view of a structure taken along OO' of FIG. 5.

FIG. 5 is a top view of a structure of another touch sensing unit according to an embodiment of the present disclosure, FIG. 6 is a cross-sectional view of a structure taken along NN' of FIG. 5, and FIG. 7 is a cross-sectional view of a structure taken along OO' of FIG. 5. Further, with reference to FIGS. 5-7, in this embodiment, a third buffer layer 501 is further provided under the first touch metal layer, and the third buffer layer 501 is provided with an aperture at a position corresponding to the first connection portion 5021 of the first touch metal layer for receiving the first connection portion 5021. The first connection portion 5021 is formed in the aperture of the third buffer layer 501, and an upper surface of the first connection portion 5021 is flush with an upper surface of the third buffer layer 501, so that the touch insulation layer can be formed with a flatter surface. The first touch electrode block 5061 is electrically connected to the first connection portion via the first through hole 5041 formed in the touch insulation layer 504. In this embodiment, the touch insulation layer 504 has a flat lower surface. The aperture of the third buffer layer 501 can penetrate the third buffer layer, and can sequentially maximize an overlapping thickness of the third buffer layer and the first connection portion, thereby maximally reducing an overlapping thickness of the third buffer layer and the first touch metal layer.

Figure 8:
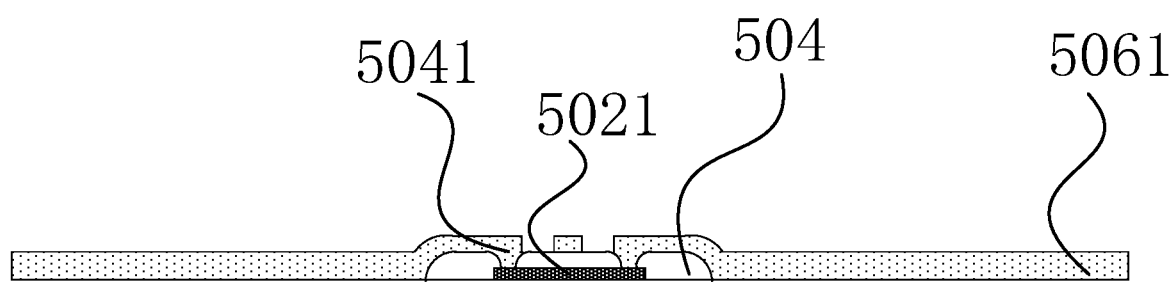
FIG. 8 is a cross-sectional view of another structure taken along NN' of FIG. 5.
Figure 9:
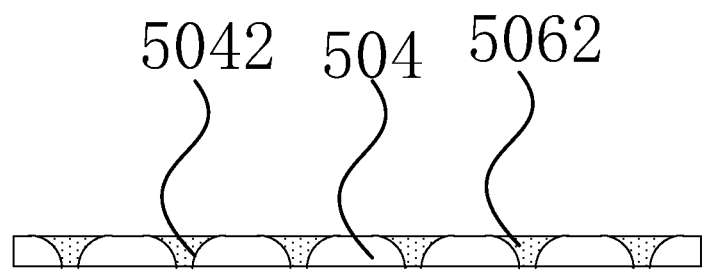
FIG. 9 is a cross-sectional view of another structure taken along OO' of FIG. 5.

FIG. 8 is a cross-sectional view of another structure taken along NN' of FIG. 5, and FIG. 9 is a cross-sectional view of another structure taken along OO' of FIG. 5. With reference to FIG. 5, FIG. 8 and FIG. 9, in this embodiment, the touch insulation layer 504 is provided with recesses 5042 for receiving the first touch electrode block 5061 and the second touch electrode block 5062. The metal grids of the first touch electrode block and the second touch electrode block are formed in the recesses 5042 of the touch insulation layer 504, and upper surfaces of the metal grids of the first touch electrode block and the second touch electrode block are flush with an upper surface of the touch insulation layer 504, thereby forming a flatter surface of the touch sensing unit. Moreover, since the grid-shaped metal is formed in the recesses 5042 of the touch insulation layer 504, the grid-shaped metal and the recesses 5042 of the touch insulation layer 504 have same widths, thereby resulting in same widths for the grid-shaped metals in different areas on the display device 10 and thus achieving the better uniformity. A portion of the touch insulation layer 504 is remained at an overlapping area between the first connection portion and the second connection portion 5021, so as to achieve insulation between the two connection portions. Since the recess 5042 is formed by dry etching and thinning the touch insulation layer 504, the recess 5042 has an arc shape. That is, a lower surface of the formed recess has a smaller area than an upper surface of the formed recess, and the lower surface has a smooth transition to the upper surface. Therefore, when forming the grid electrodes of the first touch electrode block and the second touch electrode block, the electrodes can be gradually deposited from the lower surface having a smaller surface area to the upper surface, thereby avoiding gaps caused by abrupt changes in widths, and the formed electrodes have the better performances. The recess 5042 can penetrate the touch insulation layer 504, thereby maximizing an overlapping thickness of the touch insulation layer 504 and the metal grid electrode and thus maximally reducing an overlapping thickness of the touch insulation layer 504 and the second touch metal layer. Moreover, the larger a thickness of the second touch metal layer disposed in the recess 5042 is, the better the stability is, which makes the wire not easily broken.

Figure 10:
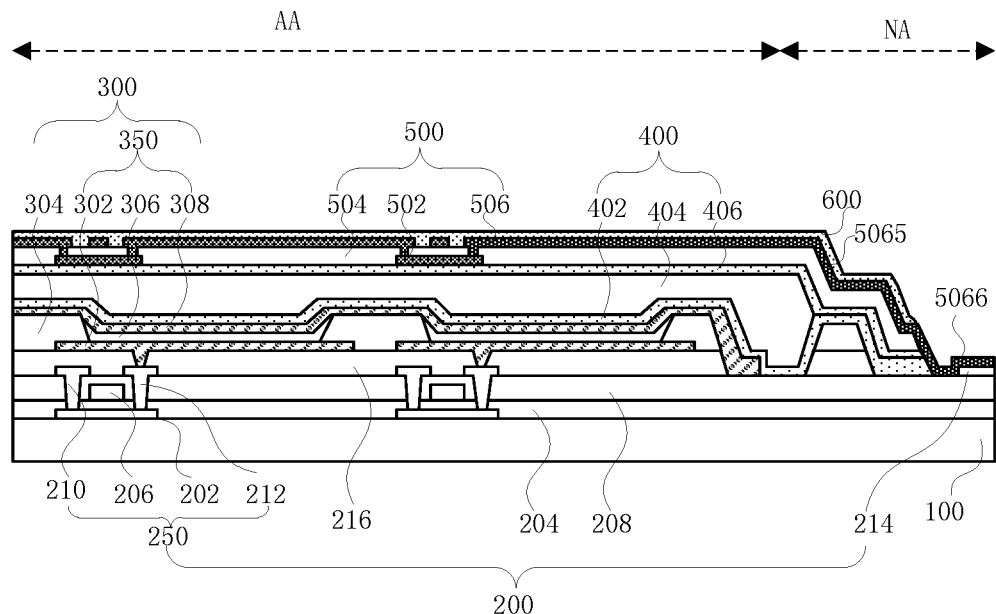
FIG. 10 is a schematic cross-sectional view of another structure of the display device taken along MM' of FIG. 1.

FIG. 10 is a cross-sectional view of another structure of the display device taken along MM' of FIG. 1. With reference to FIG. 1 and FIG. 10, the display device has a display area AA and a non-display area NA. The display area AA is located at a center of the entire display device, and the non-display area NA surrounds the display area. The display device 10 includes a substrate 100, a driving circuit layer 200, a light-emitting device layer 300, a thin film encapsulation layer 400, a touch sensing unit 500, and a protective layer 600. The driving circuit layer 200 is disposed on the substrate 100, and the driving circuit layer 200 includes a first metal layer including pins 214 located in the non-display area NA. The light-emitting device layer 300 can be disposed on the driving circuit layer 200 and include a plurality of organic light-emitting diodes. Further, each organic light-emitting diode includes a first electrode 302, a light-emitting layer 306, a second electrode 308, and a pixel definition layer 304. The pixel definition layer 304 includes apertures that expose the first electrodes 302. The thin film encapsulation layer 400 is disposed on the light-emitting device layer 300, and includes a first inorganic encapsulation layer 402, an organic encapsulation layer 404, and a second inorganic encapsulation layer 406 that are stacked. The touch sensing unit 500 is disposed on the thin film encapsulation layer 400 and includes a first touch metal layer 502, a touch insulation layer 504, and a second touch metal layer 506. The protective layer 600 is disposed on the touch sensing unit 500. A projection of the first inorganic encapsulation layer 402 onto the substrate 100, a projection of the second inorganic encapsulation layer 406 onto the substrate 100 and a projection of the touch insulation layer 504 onto the substrate 100 have coincident edges and do not cover the pins 214. The second touch metal layer includes touch pins 5066 that are electrically connected to the pins 214.

Structures of the substrate 100, the driving circuit layer 200 and the light-emitting device layer 300 can be the same as the corresponding structures in other embodiments of the present disclosure, and details thereof will not be further described herein.

The thin film encapsulation layer 400 is formed on the second electrode 308, and the thin film encapsulation layer 400 can include a first inorganic encapsulation layer 402, an organic encapsulation layer 404 and a second inorganic encapsulation layer 406 that are stacked. The thin film encapsulation layer 400 can substantially cover the entire light-emitting device layer 200 and driving circuit layer 100, and expose some necessary connection pins such as a data line pin, a driving signal pin, a touch signal pin and the like.

In this embodiment, the thin film encapsulation layer can include three encapsulation layers, i.e., the first inorganic encapsulation layer 402, the organic encapsulation layer 404 and the second inorganic encapsulation layer 406. In other embodiments of the present disclosure, the thin film encapsulation layer can include n encapsulation layers, where n is an integer that is larger than or equal to 1. The n encapsulation layers can each include an organic layer and an inorganic layer. The organic layer and the inorganic layer can be sequentially stacked on the light-emitting device layer 300.

The first inorganic encapsulation layer 402 and the second inorganic encapsulation layer 406 can include nitride, oxide, oxynitride, nitrate, carbide, or any combination thereof.

The organic encapsulation layer 404 includes, but is not limited to, acrylic acid, hexamethyldisiloxane, polyacrylates, polycarbonates, polystyrene, and the like for buffering stress of the device during bending and folding and for coverage of particulate contaminants. A dam structure can be formed at a periphery of the display area.

The first inorganic encapsulation layer 402 and the second inorganic encapsulation layer 406 can each have a thickness of approximately 30 nm to approximately 500 nm. In this embodiment, the first inorganic encapsulation layer 402 and the second inorganic encapsulation layer 406 can be formed by first forming a material layer and then performing thinning.

The touch sensing unit 500 is formed on the thin film encapsulation layer 400. The touch sensing unit 500 can be an electrostatic capacitance type touch screen. In this embodiment, a top view of the touch sensing unit can be referred to the description of other embodiments of the present disclosure, which shall not be further described herein, and only a difference thereof will be described in details as follows.

In this embodiment, the projections of the touch insulation layer 504 onto the substrate 100, the first inorganic encapsulation layer 402 onto the substrate 100 and the second inorganic encapsulation layer 406 onto the substrate 100 have coincident edges and do not cover the pins 214. The second touch metal layer includes touch pins 5066 that are electrically connected to the pins 214. In this embodiment, the first inorganic encapsulation layer 402 and the second inorganic encapsulation layer 406 are simultaneously patterned when the touch insulation layer 504 is patterned to form the first through holes that expose a part of the first touch metal layer 502. The patterning process can be performed by applying a photoresist on an encapsulating insulation material layer, performing exposure and development and then performing dry etching. The encapsulation insulation layer 504 is always covered with the photoresist during the dry etching process, and therefore, in the non-display area NA, at the edge of the encapsulation insulation layer 504, the edge of the first inorganic encapsulation layer 402 and the edge of the second inorganic encapsulation layer 406, the three layers form a slope surface, i.e., the edges of the three insulation layers have same outlines and can simultaneously expose the pins 214.

In this embodiment, before forming the second touch metal layer 506, the touch insulation layer 504, the first inorganic encapsulation layer 402 and the second inorganic encapsulation layer 406 are patterned. Therefore, the touch pins 5066 included in the formed second touch metal layer 506 can be electrically connected to the pins 214, and are electrically connected to the first touch electrode blocks and the second touch electrode blocks by the first touch leading wires and the second touch leading wires 5065. In this way, the pins of both of the touch signal and the display signal are led out from the first metal layer located in the driving circuit layer, and finally only one flexible printed circuit board is used for common driving of the display and the touch.

In some other embodiments of the present disclosure, a third buffer layer can be provided between the thin film encapsulation layer 400 and the touch sensing unit 500. The third buffer layer can be formed directly on the second inorganic encapsulation layer 406 of the thin film encapsulation layer 400, and the third buffer layer can be formed directly on the thin film encapsulation layer by vapor deposition. When the display device includes the third buffer layer, the third buffer layer can be patterned during the patterning of the touch insulation layer 504, so as to expose the pins 214.

The protective layer 600 is further formed on the touch sensing unit. In a process of forming the protective layer 600, a protective preparation layer can be first formed by a low temperature chemical vapor deposition (LT-CVD) technique, and the protective preparation layer can include an inorganic material or an organic material. After the protective preparation layer is formed, the protective preparation layer is patterned. Then, an edge of the patterned protective layer exposes the pins 214. The edge of the protective layer can or cannot be coincident with an edge of the first inorganic encapsulation layer. After the protective layer 600 is patterned, the protective layer can be thinned by dry etching, thereby further improving bending resistance of the display device 10.

For the display device provided by this embodiment, the first inorganic encapsulation layer 402 and the second inorganic encapsulation layer 406 are simultaneously patterned when the touch insulation layer 504 is patterned to form the first through holes that expose a part of the first touch metal layer 502. Therefore, compared with the related art in which multiple masks are used, this embodiment provides a simpler process. Moreover, in this embodiment, multiple insulation layers are thinned, thereby further improving the bending resistance.

In some other embodiments of the present disclosure, a second buffer layer can be further provided between the light-emitting device layer 300 and the first inorganic encapsulation layer 402. The second buffer layer can reduce impurities that would permeate the light-emitting device layer 300 after penetrating the first inorganic encapsulation layer 402.

In some other embodiments of the present disclosure, an atomic layer deposited layer can be further provided between the second buffer layer and the first inorganic encapsulation layer.

In some other embodiments of the present disclosure, the thin film encapsulation layer can include only the second buffer layer, the atomic layer deposited layer and the first inorganic encapsulation layer, and does not include the organic encapsulation layer and the second inorganic encapsulation layer. In this case, the second buffer layer, the atomic layer deposited layer and the first inorganic encapsulation layer can be simultaneously patterned when the touch insulation layer 504 is being patterned, so as to expose the pins 214. The finally formed second buffer layer, atomic layer deposited layer, first inorganic encapsulation layer and touch insulation layer 504 have same outlines. Finally, the first touch leading wires and the second touch leading wires formed in the second touch metal layer 506 cross the second buffer layer. The slope at the edges of the atomic layer deposited layer, the first inorganic encapsulation layer and the touch insulation layer 504 are electrically connected to the touch pins 5066, and the touch pins 5066 are electrically connected to the pins 214.

Further, in this embodiment, the touch insulation layer 504 can be provided with a recess, and details thereof can refer to the description of other embodiments of the present disclosure and will not be further described herein.

Figure 11:
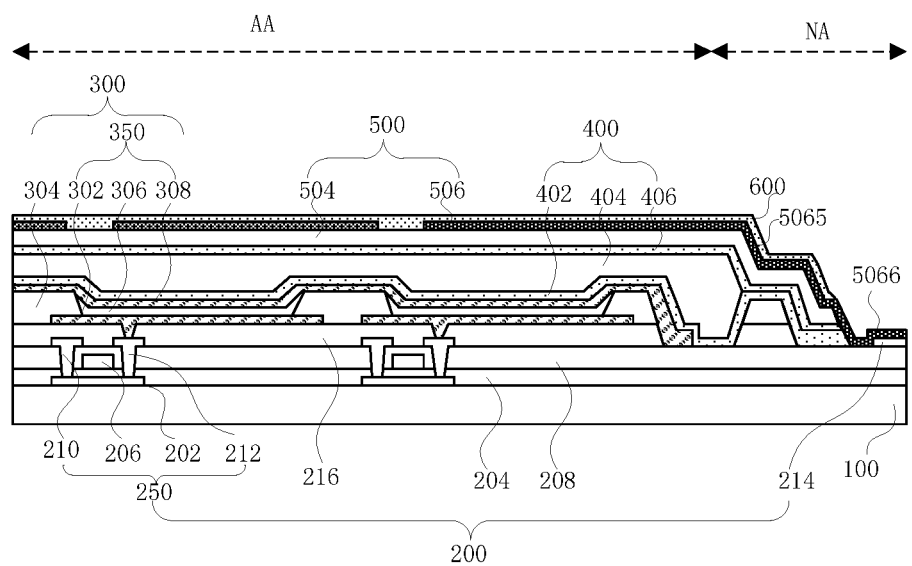
FIG. 11 is a cross-sectional view of still another structure of the display device taken along MM' of FIG. 1.
Figure 12:
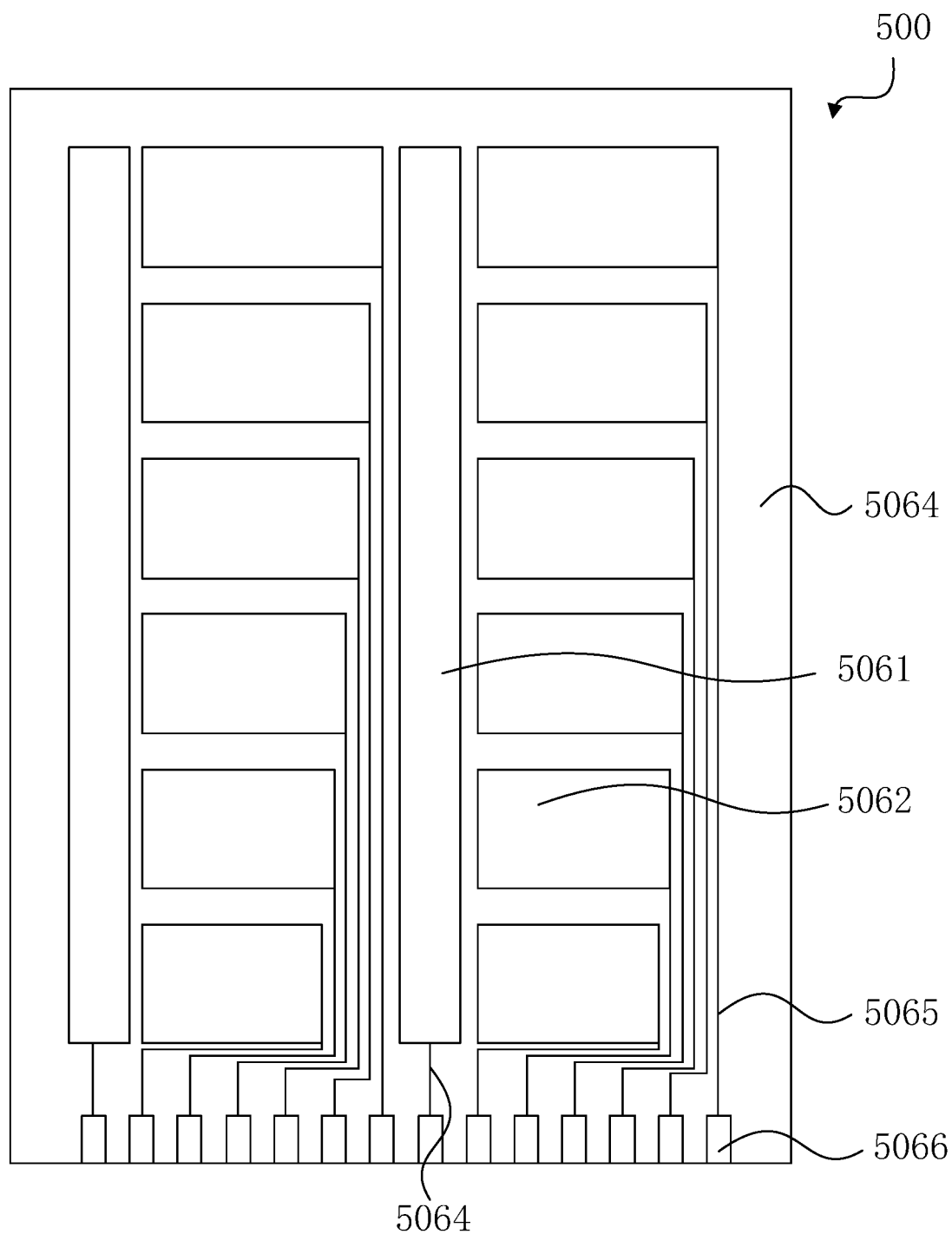
FIG. 12 is a top view of a structure of a touch sensing unit of FIG. 11.

FIG. 11 is a cross-sectional view of still another structure of the display device taken along MM' of FIG. 1, and FIG. 12 is a top view of a structure of a touch sensing unit of FIG. 11. With reference to FIG. 1, FIG. 11 and FIG. 12, the display device has a display area AA and a non-display area NA. The display area AA is located at a center of the entire display device, and the non-display area NA surrounds the display area. The display device 10 includes a substrate 100, a driving circuit layer 200, a light-emitting device layer 300, a thin film encapsulation layer 400, a touch sensing unit 500, and a protective layer 600. The driving circuit layer 200 is disposed on the substrate 100, and the driving circuit layer 200 includes a first metal layer. The first metal layer includes pins 214 located in the non-display area NA. The light-emitting device layer 300 can be disposed on the driving circuit layer 200 and include a plurality of organic light-emitting diodes. Further, each organic light-emitting diode includes a first electrode 302, a light-emitting layer 306, a second electrode 308, and a pixel definition layer 304. The pixel definition layer 304 includes apertures that expose the first electrodes 302. The thin film encapsulation layer 400 is disposed on the light-emitting device layer 300, and includes a first inorganic encapsulation layer 402, an organic encapsulation layer 404, and a second inorganic encapsulation layer 406 that are stacked. The touch sensing unit 500 is disposed on the thin film encapsulation layer 400 and includes a touch insulation layer 504 and a second touch metal layer 506. The protective layer 600 is disposed on the touch sensing unit 500. A projection of the first inorganic encapsulation layer 402 onto the substrate 100, a projection of the second inorganic encapsulation layer 406 onto the substrate 100 and a projection of the touch insulation layer 504 onto the substrate 100 have coincident edges and do not cover the pins 214. The second touch metal layer includes touch pins 5066 that are electrically connected to the pins 214.

Structures of the substrate 100, the driving circuit layer 200, the light-emitting device layer 300 and the thin film encapsulation layer 400 can be the same as the corresponding structures in other embodiments of the present disclosure, and details thereof will not be further described herein.

The touch sensing unit 500 is formed on the thin film encapsulation layer 400. The touch sensing unit 500 can be an electrostatic capacitance type touch screen. In this embodiment, touch electrodes of the touch sensing unit 500 are of a single layer structure.

A second touch metal layer 506 is further provided on the touch insulation layer 504, and the second touch metal layer includes a plurality of first touch electrode blocks 5061, a plurality of second touch electrode blocks 5062, a plurality of first touch leading wires 5064, a plurality of second touch leading wires 5065, and a plurality of touch pins 5066. The first touch electrode blocks 5061 are electrically connected to the first touch leading wires 5064, and the second touch electrode blocks 5062 are electrically connected to the second touch leading wires 5065. The first touch leading wires 5064 and the second touch leading wires 5065 are electrically connected to the touch pins 5066.

In this embodiment, the projections of the touch insulation layer 504 onto the substrate 100, the first inorganic encapsulation layer 402 onto the substrate 100, and the second inorganic encapsulation layer 406 onto the substrate 100 have coincident edges and do not cover the pins 214. The second touch metal layer includes touch pins 5066 that are electrically connected to the pins 214. In this embodiment, the first inorganic encapsulation layer 402 and the second inorganic encapsulation layer 406 are simultaneously patterned when the touch insulation layer 504 is being patterned to form the first through holes that expose a part of the first touch metal layer 502. The patterning process can be performed by applying a photoresist on an encapsulation insulation material layer 504, performing exposure and development and then performing dry etching. The encapsulation insulation layer 504 is always covered with the photoresist during the dry etching process, and therefore, in the non-display area NA, at the edge of the encapsulation insulation layer 504, the edge of the first inorganic encapsulation layer 402 and the edge of the second inorganic encapsulation layer 406, the three layers form a slope surface, i.e., the edges of the three insulation layers have same outlines and simultaneously expose the pins 214.

In this embodiment, before forming the second touch metal layer 506, the touch insulation layer 504, the first inorganic encapsulation layer 402 and the second inorganic encapsulation layer 406 are patterned. Therefore, the touch pins 5066 included in the formed second touch metal layer 506 can be electrically connected to the pins 214, and are electrically connected to the first touch electrode blocks and the second touch electrode blocks by the first touch leading wires and the second touch leading wires 5065. In this way, the pins of both of the touch signal and the display signal are led out from the first metal layer located in the driving circuit layer, and finally only one flexible printed circuit board is used for common driving of the display and the touch.

In some other embodiments of the present disclosure, a third buffer layer can be provided between the thin film encapsulation layer 400 and the touch sensing unit 500.

The protective layer 600 is further formed on the touch sensing unit 500. For a structure of the protective layer 600, reference can be made to the description of the other embodiments of the present disclosure, and details thereof will not be further described herein.

For the display device provided by this embodiment, the first inorganic encapsulation layer 402 and the second inorganic encapsulation layer 406 are simultaneously patterned when the touch insulation layer 504 is being patterned to form first through holes that expose a part of the first touch metal layer 502. Therefore, compared with the related art in which multiple masks are used, this embodiment provides a simpler process. Moreover, in this embodiment, multiple insulation layers are thinned, thereby further improving the bending resistance.

In some other embodiments of the present disclosure, a second buffer layer can be further provided between the light-emitting device layer 300 and the first inorganic encapsulation layer 402. The second buffer layer can reduce impurities that would permeate the light-emitting device layer 300 after penetrating the first inorganic encapsulation layer 402.

In some other embodiments of the present disclosure, an atomic layer deposited layer can be further provided between the second buffer layer and the first inorganic encapsulation layer.

In some other embodiments of the present disclosure, the thin film encapsulation layer can include only the second buffer layer, the atomic layer deposited layer and the first inorganic encapsulation layer, and does not include the organic encapsulation layer and the second inorganic encapsulation layer. In this case, the second buffer layer, the atomic layer deposited layer and the first inorganic encapsulation layer can be simultaneously patterned when the touch insulation layer 504 is being patterned, so as to expose the pins 214. The finally formed second buffer layer, atomic layer deposited layer, first inorganic encapsulation layer and touch insulation layer 504 have same outlines. Finally, the first touch leading wires and the second touch leading wires formed in the second touch metal layer 506 cross the second buffer layer. The slope at the edges of the atomic layer deposited layer, the first inorganic encapsulation layer and the touch insulation layer 504 are electrically connected to the touch pins 5066, and the touch pins 5066 are electrically connected to the pins 214.

Further, in this embodiment, the touch insulation layer 504 can be provided with a recess, and for details thereof, reference can be made to the description of other embodiments of the present disclosure, which will not be further described herein.

Figure 13:
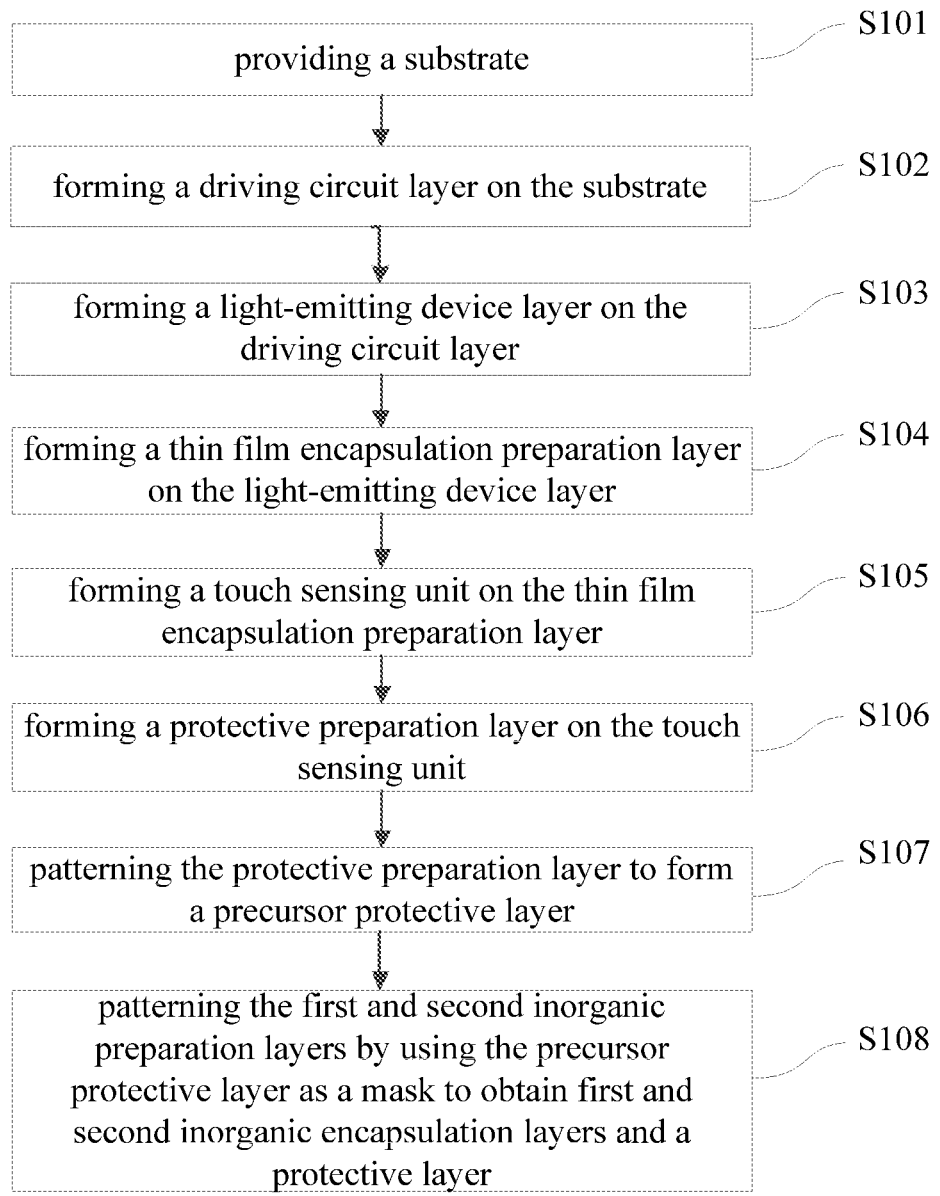
FIG. 13 is a schematic flowchart of a method for manufacturing a display device according to an embodiment of the present disclosure.

FIG. 13 is a schematic flowchart of a method for manufacturing a display device according to an embodiment of the present disclosure. With reference to FIG. 13, the method includes following steps.

At step S101, a substrate is provided.

At step S102, a driving circuit layer is formed on the substrate. The driving circuit layer includes a first metal layer, and the first metal layer includes pins located in the non-display area.

At step S103, a light-emitting device layer is formed on the driving circuit layer. The light-emitting device layer includes: organic light-emitting diodes, each of which includes a first electrode, a light-emitting layer and a second electrode disposed on the driving circuit layer; and a pixel definition layer, including apertures exposing the first electrode.

At step S104, a thin film encapsulation preparation layer is formed on the light-emitting device layer. The film encapsulation preparation layer includes a first inorganic preparation layer.

At step 105, a touch sensing unit is formed on the thin film encapsulation layer. The touch sensing unit includes a touch insulation layer and a second touch metal layer.

At step S106, a protective preparation layer is formed on the touch sensing unit.

At step S107, the protective preparation layer is patterned to form a precursor protective layer.

At step S108, the first inorganic preparation layer is patterned by using the precursor protective layer as a mask to form a first inorganic encapsulation layer, and then a protective layer is obtained.

A projection of the first inorganic encapsulation layer onto the substrate and a projection of the protective layer onto the substrate have coincident edges and do not cover the pins.

Figure 14:
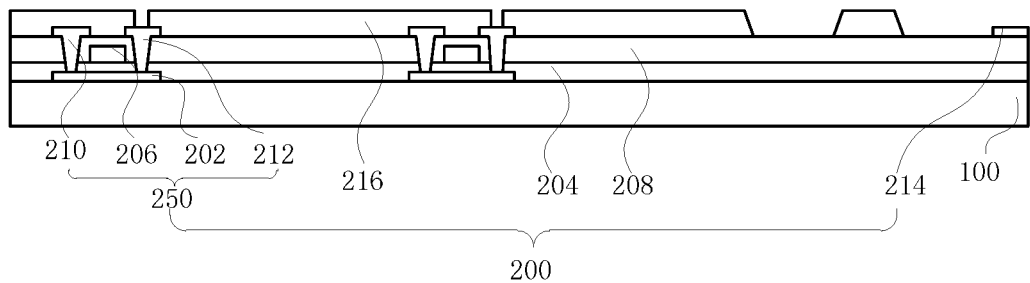
FIG. 14 is a cross-sectional view of a structure corresponding to steps S101 and S102 of FIG. 13.

FIG. 14 is a cross-sectional view of a structure corresponding to steps S101 and S102 of FIG. 13. With reference to FIG. 13 and FIG. 14, steps S101 and S102 are performed. At step S101, a substrate is provided. In an embodiment of the present disclosure, the substrate 100 can be a flexible substrate, and can include a plastic material, for details of which reference can be made to the description of other embodiments of the present disclosure, and will not be further described herein.

At step S102, a driving circuit layer is formed on the substrate.

The driving circuit layer 200 is formed on the substrate 100. The driving circuit layer includes a plurality of pixel circuits that drive the light-emitting diodes to emit light, and each of the pixel circuits includes at least two thin film transistors and one capacitor.

As shown in FIG. 14, a thin film transistor 250 is formed on the substrate 100. The thin film transistor 250 includes an active layer 202, a gat electrode 206, a source electrode 210 and a drain electrode 212.

First, the active layer is formed on the substrate 100, and the active layer 202 can include an inorganic semiconductor such as silicon, or the active layer 202 can include an organic semiconductor. The active layer 202 can include a source region, a drain region, and a channel region.

A gate insulation layer 204 is formed on the active layer 202. The gate insulation layer 204 is configured to insulate the gate electrode 206 from the active layer 202. The gate insulation layer 204 can include an inorganic material such as $SiN_x$ or $SiO_2$.

The gate electrode 206 is formed in a predetermined region of the gate insulation layer 204. The gate electrode 206 can be connected to a gate line. A metal in the same layer as the gate electrode can further include other components such as a signal driving line located in the non-display area and a light-emitting signal line located in the display area.

An interlayer insulation layer 208 is formed on the gate electrode 206. The interlayer insulation layer 208 can insulate the gate electrode 206 from the source electrode 210 and the drain electrode 212. The interlayer insulation layer 208 can include an inorganic material such as $SiN_x$ or $SiO_2$.

The source electrode 210 and the drain electrode 212 are formed on the interlayer insulation layer 208. The interlayer insulation layer 208 and the gate insulation layer 204 include through holes that expose the source region and the drain region of the active layer 202. The source electrode 210 and the drain electrode 212 are in direct contact with the exposed source region and drain region of the active layer 202 via the through holes, respectively. In an embodiment of the present disclosure, the metal in the same layer as the source electrode and the drain electrode can further include other components such as pins 214 located in the non-display area, and a data line and a power signal line located in the display area. In this embodiment, the metal layer is referred to as a first metal layer.

A planarization layer 216 is formed on the source electrode 210 and the drain electrode 212, which can protect the thin film transistor 250 from external influences, and can allow the driving circuit layer to have a relatively flat surface. In this way, it is advantageous to preparation of subsequent devices. The planarization layer is provided with a plurality of apertures that expose the drain electrodes. The planarization layer 216 can include an inorganic insulation layer and/or an organic insulation layer.

A first buffer layer can be formed on the substrate before forming the active layer 202.

Figure 15:
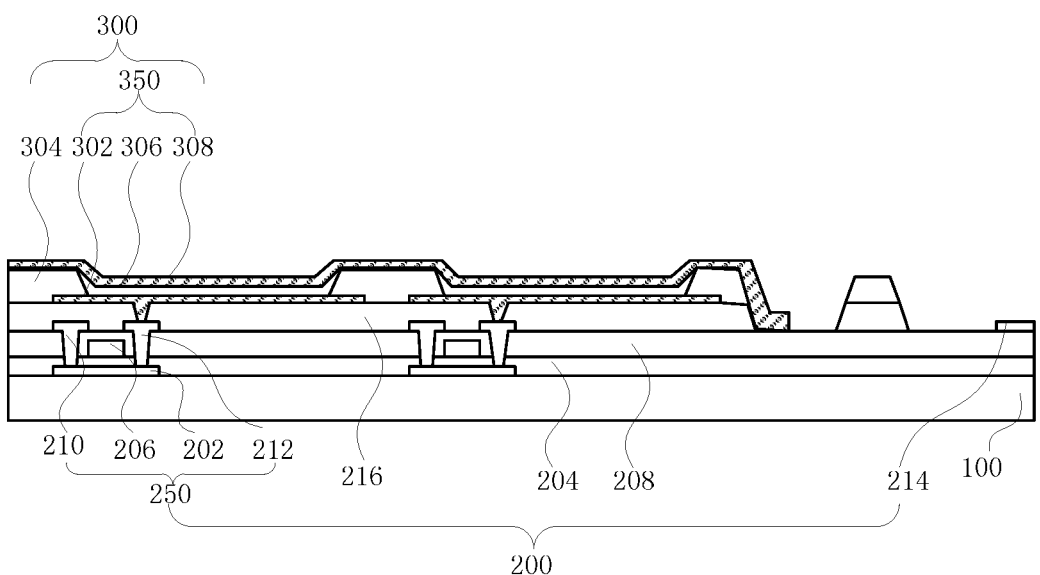
FIG. 15 is a cross-sectional view of a structure corresponding to step S103 of FIG. 13.

FIG. 15 is a cross-sectional view of a structure corresponding to step S103 of FIG. 13. With reference to FIG. 13 and FIG. 15, step S103 is performed to form a light-emitting device layer on the driving circuit layer. The light-emitting device layer 300 is formed on the planarization layer 216, i.e., on the driving circuit layer 200. The light-emitting device layer includes a plurality of organic light-emitting diodes 350 and a pixel definition layer 304. Each of the plurality of organic light-emitting diodes 350 includes a first electrode 302, a light-emitting layer 306 and a second electrode 308.

The first electrode 302 is formed on the planarization layer 216 and is electrically connected to the drain electrode 212 via a through hole formed in the planarization layer 216 that exposes a part of the drain electrode 212.

The pixel definition layer 304 is formed on the first electrode 302, and the pixel definition layer 304 can be formed by spin coating. The pixel definition layer 304 can expose a predetermined region of the first electrode 302.

The light-emitting layer is formed in the aperture region of the pixel definition layer 304, and the light-emitting layer 306 includes an organic material with a low molecular weight or an organic material with a high molecular weight. The light-emitting layer 306 can include at least one layer of a hole transport layer (HTL), a hole injection layer (HIL), an electron transport layer (ETL), and an electron injection layer (EIL). The pixel definition layer 304 covers a gap between adjacent first electrodes 302, and partially covers edges of the first electrodes 302, and includes a plurality of apertures exposing the first electrodes 302. The light-emitting layer 306 is formed correspondingly to each aperture formed in the pixel definition layer 304.

The second electrode 308 is formed on the light-emitting layer 306, and the second electrode 308 covers a plurality of light-emitting layers 306 and the pixel definition layer 304.

Figure 16:
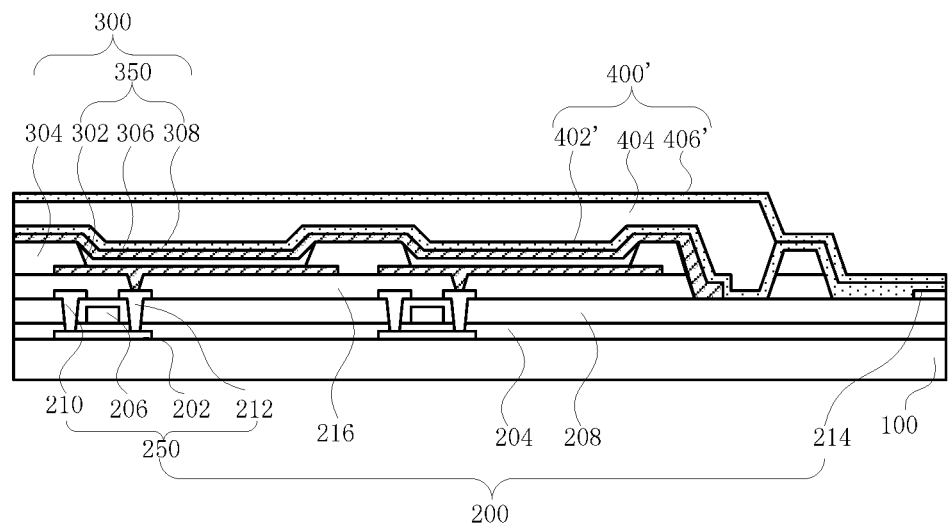
FIG. 16 is a cross-sectional view of a structure corresponding to step S104 of FIG. 13.

FIG. 16 is a cross-sectional view of a structure corresponding to step S104 of FIG. 13. With reference to FIG. 13 and FIG. 16, step S104 is performed to form a thin film encapsulation preparation layer on the light-emitting device layer 300. Forming the thin film encapsulation material layer includes: forming a first inorganic encapsulation material layer, and then thinning the first inorganic encapsulation material layer to obtain a first inorganic preparation layer; forming an organic encapsulation layer; and forming a second inorganic encapsulation material layer, and then thinning the second inorganic encapsulation material layer to obtain a second inorganic preparation layer.

The first inorganic encapsulation material layer is formed by low temperature chemical vapor deposition, and then the first inorganic encapsulation material layer is thinned to obtain the first inorganic preparation layer. The first inorganic material layer can include silicon nitride, aluminum nitride, zirconium nitride, titanium nitride, hafnium nitride, tantalum nitride, silicon oxide, aluminum oxide, titanium oxide, tin oxide, cerium oxide, silicon nitrate, silicon oxynitride or any combination thereof. An entire surface of the first inorganic material layer is etched by using $BCl_3$ to thin the first inorganic material layer. The first inorganic material layer can have a thickness of 0.4 μm -1 μm, and the first inorganic preparation layer 402' after thinning has a thickness of 0.03 μm -0.4 μm. After thinning, its foldability can be greatly improved while alleviating the problem that the film layer may peel off due to the stress. The first inorganic preparation layer 402' formed as a whole layer covers an entire surface of the display device 10, i.e., covering the pins 214.

After the first inorganic preparation layer 402' is formed, the organic encapsulation layer 404 is formed by inkjet printing. In order to avoid flowing during printing of the organic encapsulation layer, which would otherwise result in an uncontrollable area, a printing area can be slightly larger than an area of the display area AA. The inorganic encapsulation layer has a main function of preventing water and oxygen, and the organic encapsulation layer has a main function of absorption of stress and coverage of contaminated particles. Further, since the organic encapsulation layer 404 is formed by inkjet printing, a dam structure can be formed at a periphery of the display area to delimit an outer edge of the organic encapsulation layer 404. The dam structure can be made of a material that is in the same layer as the planarization layer 216 and/or the pixel definition layer 304, and can also include a material in other film layer. It should be noted that in other embodiments of the present disclosure, the dam structure is not necessary, and an edge range of the organic encapsulation layer can be controlled by controlling a concentration of a printed material, a position of a nozzle and the like during the inkjet printing process.

After the organic encapsulation layer 404 is formed, the second inorganic preparation layer 406' is formed. Similar to formation of the first inorganic preparation layer 402', the second inorganic encapsulation material layer is formed by low temperature chemical vapor deposition, and then the second inorganic encapsulation material layer is thinned to obtain the second inorganic preparation layer 406'. The second inorganic material layer can include silicon nitride, aluminum nitride, zirconium nitride, titanium nitride, hafnium nitride, tantalum nitride, silicon nitride, aluminum oxide, titanium oxide, tin oxide, cerium oxide, silicon nitrate, silicon oxynitride or any combination thereof. An entire surface of the second inorganic material layer is etched by using $BCl_3$ to thin the second inorganic material layer. The second inorganic material layer can have a thickness of 0.4 μm -1 μm, and the second inorganic preparation layer 402' after thinning has a thickness of 0.03 μm -0.4 μm. After thinning, its foldability can be greatly improved while alleviating the problem that the film layer may peel off due to the stress. The second inorganic preparation layer 406' formed as a whole layer covers the entire surface of the display device 10, i.e., covering the pins 214.

In some other embodiments of the present disclosure, a second buffer preparation layer can be formed on the light-emitting device layer before forming the first inorganic preparation layer 402', and the second buffer preparation layer can be formed with the same material and process as those of the first inorganic preparation layer 402' and the second inorganic preparation layer 406'. That is, it is formed as a whole layer and is then thinned, and details thereof will not be further described herein. The second buffer preparation layer after thinning can have a thickness of 30 nm-300 nm. The second buffer preparation layer covers the entire surface of the display device 10, i.e., covering the pins 214.

An atomic layer deposited layer can be further formed between the second buffer preparation layer and the first inorganic preparation layer. A material, in a monoatomic film form, is plated one by one on a surface of the substrate i.e., on the second buffer layer, by an atomic layer deposition technique. The atomic layer deposition preparation layer is also of a whole layer structure. An atomic deposition preparation layer formed as a whole layer covers the entire surface of the display device 10, i.e., covering the pins 214. When forming the atomic deposition preparation layer, an oxide dielectric layer such as $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O_3$, $SrTiO_3$, or $BaTiO_3$ can be adopted. A chemical reaction of a new atomic film is directly associated with a previous layer during an atomic layer deposition process, and therefore, when the finally formed display device includes an atomic layer deposited layer, the second buffer layer is preferably LiF, so as to be matched with a lattice of the atomic layer deposited layer. The atomic layer deposition preparation layer covers the entire surface of the display device 10, i.e., covering the pins 214.

In some other embodiments of the present disclosure, the thin film encapsulation layer can include only the second buffer layer, the atomic layer deposited layer and the first organic encapsulation layer, and does not include the organic encapsulation layer and the second inorganic encapsulation layer. In this case, the thickness of the display device can be greatly reduced, and the bending resistance can be improved. When the thin film encapsulation layer of the display device does not include the organic encapsulation layer and the second inorganic encapsulation portion, it is not needed to form the organic encapsulation layer and the second inorganic preparation layer.

Figure 17:
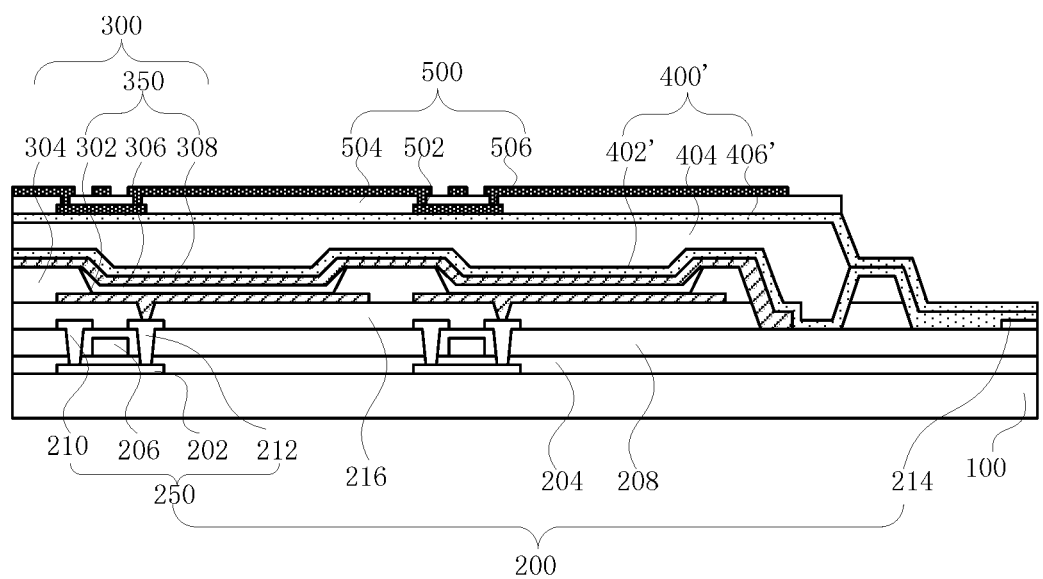
FIG. 17 is a cross-sectional view of a structure corresponding to step S105 of FIG. 13.

FIG. 17 is a cross-sectional view of a structure corresponding to step S105 of FIG. 13. With reference to FIG. 17 and FIG. 13, step S105 is performed to form a touch sensing unit 500 on the thin film encapsulation preparation layer. Forming the touch sensing unit 500 includes: forming a first touch metal layer 502, forming a touch insulation layer 504, and forming a second touch metal layer 506.

A first touch metal material layer is formed, and the material layer can be made of a material selected from at least one of copper, aluminum, molybdenum, and silver, which can have relatively high conductivity. Then, the metal material layer is patterned to form the first touch metal layer 502. The patterning process can be performed by chemical wet etching.

In some other embodiments of the present disclosure, the method for forming the first touch metal layer can be a printing method. Compared with the etching method, it is not necessary for the printing method to prepare a photolithography layer and perform exposure and development before etching, thereby reducing processes and avoiding etching impurities that can be introduced by chemical wet etching.

After the first touch metal layer 502 is formed by patterning, the touch insulation layer is formed on the first touch metal layer, and a process thereof includes: forming a touch insulation material layer, which can be selected from at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride; and then patterning the touch insulation material to form the touch insulation layer 504. The patterning process can be a dry etching process.

After the touch insulation layer 504 is formed, the second touch metal layer is formed. A method of forming the second touch metal layer 506 is the same as the method for forming the first touch metal layer, and details will not be further described herein.

In this embodiment, the first touch metal layer 502 after patterning includes a plurality of first connection portions, and the second touch metal layer 506 after patterning includes components such as a plurality of first touch electrode blocks, a plurality of second touch electrode blocks, a plurality of second connection portions, a plurality of first touch leading wires, and a plurality of second touch leading wires. The touch insulation layer 504 is further formed between the first touch metal layer 502 and the second touch metal layer 506. The touch insulation layer 504 is provided with a plurality of first through holes that expose a part of the plurality of first connection portions.

Multiple first touch electrode blocks arranged in a first direction are electrically connected to the first connection portions via the first through holes to form the touch transmitting electrode. The multiple touch transmitting electrodes extend in the first direction and are arranged in a second direction. Multiple second touch electrode blocks arranged in the second direction are electrically connected to each other by the second connection portions that are in the same layer as the second touch electrode blocks, so as to form the touch sensing electrode. The multiple touch sensing electrodes extend in the second direction and are arranged in the first direction. The touch transmitting electrode is connected to the touch pin through the first touch leading wire, and the touch sensing electrode is connected to the touch pin through the second touch leading wire. For a structure of the touch sensing unit 500, reference can be made to the description of the other embodiments of the present disclosure, and will not be further described herein.

In this embodiment, the formed touch insulation layer 504 includes only the first through holes exposing the first connection portions. However, in other embodiments of the present disclosure, the finally formed touch sensing unit can be of the structure as shown in FIG. 7 to FIG. 9. In this case, in a process of patterning the touch insulation layer, recesses can be formed at a preset position in the touch insulation layer. The recesses can be formed in the same manner as that of the first through holes, which are formed by exposure and development of a photoresist. Positions of the recesses correspond to the grid metal electrodes of the touch electrode blocks.

After the touch insulation layer is etched by exposure and development and the photoresist is removed, the touch insulation layer can be further thinned. The thinning process is to perform dry etching on a whole layer after removing photoresist. Since an etching atmosphere has different contact areas and different moving speeds at different positions during the dry etching process, the finally formed recesses are arc-shaped recesses. Due to thinning of the entire layer, the finally formed touch insulation layer can have a thickness of 0.4 µm-0.5 µm, which is comparable to the thickness of the metal layer. Therefore, after the grid-shaped metal electrodes are formed in the recesses, a thickness of the metal electrode can be the same as the thickness of the touch insulation layer, thereby improving flatness of the panel and thus further improving the bending resistance. The touch insulation after thinning has the thickness of 0.4 µm-0.5 µm, which is larger than the thickness of the first inorganic preparation layer after thinning or the thickness of the second inorganic preparation layer after thinning. The finally formed arc has a length-to-height ratio that is smaller than 40:1. This can prevent a slope of the insulation layer between two adjacent metal grid lines from being too gentle, which can cause that the recesses are not deep enough to receive the metal electrodes.

In some other embodiments of the present disclosure, before forming the touch sensing unit 500, the method can further include forming a third buffer preparation layer on the thin film encapsulation preparation layer. The third buffer preparation layer can be formed directly on the second inorganic preparation layer 406' of the thin film encapsulation preparation layer 400'. The third buffer preparation layer can include a material capable of forming a flat surface. For example, the third buffer preparation layer can include an inorganic material such as silicon oxide, silicon nitride, silicon oxynitride, aluminum oxide, aluminum nitride, titanium oxide or titanium nitride. The third buffer preparation layer can also include an organic material such as polyimide, polyester or acrylic acid. The third buffer preparation layer can be of a single layer structure or a multilayer structure. When the third buffer preparation layer is of a multilayer structure, the multilayer structure can be selected from any combination of the above-mentioned inorganic materials or organic materials. The third buffer preparation layer can be formed directly on the thin film encapsulation layer by vapor deposition. The third buffer preparation layer covers the entire surface of the display device 10, i.e., covering the pins 214.

The formation method and structure of the third buffer preparation layer can be the same as those of the second buffer preparation layer, and it can also be thinned finally, and a thickness after thinning can be 0.4 µm-0.5 µm.

In some other embodiments of the present disclosure, before thinning the third buffer preparation layer, the third buffer preparation layer can be patterned to form a third buffer layer. The third buffer layer can be provided with recesses that receive a pattern of the first touch metal layer. Since an etching atmosphere has different contact areas and different moving speeds at different positions during the dry etching process, the finally formed recesses are arc-shaped recesses. Due to thinning of the entire layer, the finally formed third buffer layer can have a thickness of 0.4 µm-0.5 µm, which is comparable to the thickness of the metal layer. Therefore, after the grid-shaped metal electrodes are formed in the recesses, a thickness of the metal electrode can be the same as the thickness of the touch insulation layer, thereby improving flatness of the panel and thus further improving the bending resistance.

Figure 18:
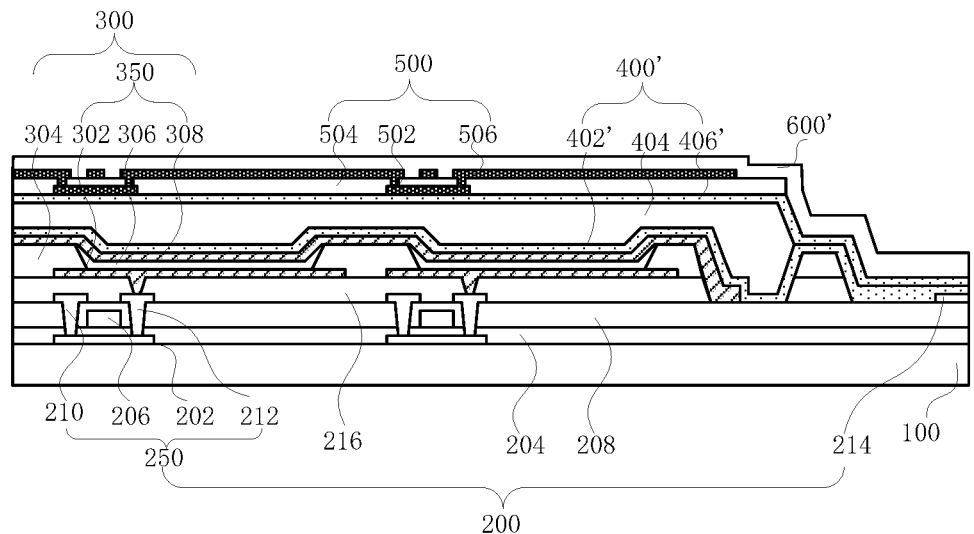
FIG. 18 is a cross-sectional view of a structure corresponding to step S106 of FIG. 13.

FIG. 18 is a cross-sectional view of a structure corresponding to step S106 of FIG. 13. With reference to FIG. 13 and FIG. 18, step S106 is performed to form a protective preparation layer 600' on the touch sensing unit. The protective preparation layer 600' can include an organic material or an inorganic material. When the protective preparation layer includes an inorganic material, the inorganic material can include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, however, the embodiments of the present disclosure are not limited thereto. When the protective preparation layer includes an organic material, the organic material can include at least one of acrylic resin, methacrylic resin, polyisoprene, vinyl resin, epoxy resin, carbamate resin, polydimethylsiloxane, polyimide, acrylate, polyethylene terephthalate, polyethylene naphthalate and cellulose resin.

The protective preparation layer 600' can be formed by low temperature chemical vapor deposition, and the protective preparation layer 600' covers the entire surface of the display device 10, i.e., covering the touch sensing unit 500, the thin film encapsulation preparation layer 400', and all of the film layers thereunder. In this embodiment, the protective preparation layer 600' can include silicon oxynitride. Optionally, a material of the protective preparation layer 600' can be different from materials of the first inorganic preparation layer and the second inorganic preparation layer. Moreover, the protective preparation layer 600' can have a thickness of 400 nm-1000 nm.

Figure 19:
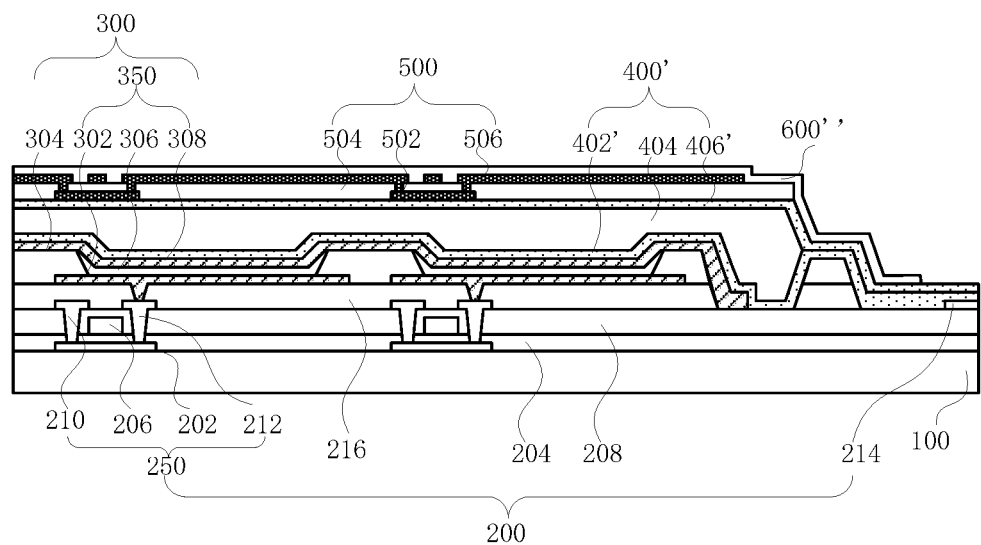
FIG. 19 is a cross-sectional view of a structure corresponding to step S107 of FIG. 13.

FIG. 19 is a cross-sectional view of a structure corresponding to step S107 of FIG. 13. With reference to FIG. 13 and FIG. 19, step S107 is performed to pattern the protective preparation layer so as to obtain a precursor protective layer 600". Patterning the protective preparation layer can include: coating the protective preparation layer with photoresist, exposing and developing the photoresist, and etching the protective preparation layer to form the precursor protective layer 600". A projection of the precursor protective layer 600" onto the substrate 100 does not cover the pins 214. Since the precursor protective layer 600" is formed by exposure and development etching, during the etching process, the protective preparation layer is always covered with the photoresist, so a thickness of the precursor protective layer 600" is the same as a thickness of the protective preparation layer. Moreover, an edge of the precursor protective layer does not form an arc-shaped slope.

With reference to FIG. 13 and FIG. 2, step S108 is performed. The first inorganic preparation layer 402' and the second inorganic preparation layer 406' are patterned by using the precursor protective layer 600" as a mask to form the first inorganic encapsulation layer 402, the second inorganic encapsulation layer 406 and the protective layer 600. When patterning the first inorganic preparation layer 402' and the second inorganic preparation layer 406', the first inorganic preparation layer 402' and the second inorganic preparation layer 406' are directly patterned by dry etching using the precursor protective layer 600" as a mask. During a process of patterning the first inorganic the preparation layer 402' and the second inorganic preparation layer 406', since etching gas also has an etching effect on the precursor protective layer 600" and etches the entire precursor protective layer 600", the protective layer is thinned by the etching gas. The finally formed protective layer after thinning has a thickness of 50 nm-300 nm. Moreover, since an edge area and a central area have different etching rates during the etching process, the thickness of the finally formed protective layer gradually increases from the edge area towards the central area. Further, the protective layer can include an arc-shaped slope portion having a length L1 and a maximum height H1, where 300≤L1/H1≤600. Within this range, the slope has a relatively smooth transition and can provide good protection.

Since the first inorganic encapsulation layer 402 and the second inorganic encapsulation layer 406 are formed by using the precursor protective layer 600" as a mask in the patterning process, the projections of the first inorganic encapsulation layer 402 on to the substrate 100, the second inorganic encapsulation layer 406 onto the substrate 100 and the protective layer 600 onto the substrate 100 have coincident edges. Moreover, the projections of the first inorganic encapsulation layer 402 on to the substrate 100, the second inorganic encapsulation layer 406 onto the substrate 100 and the protective layer 600 onto the substrate 100 do not cover the pins 214, thereby allowing a normal connection between the pins and the driving module. The three layers use a same mask. Therefore, compared with the related art in which different insulation layers use different masks, this embodiment of the present disclosure saves masks and the etching process, thereby greatly improving the production efficiency and reducing the cost.

When the finally formed display device includes the second buffer layer, the atomic layer deposited layer and the third buffer layer, at step S108, the second buffer preparation layer, the atomic layer deposition preparation layer and the third buffer preparation layer can be further etched. Thus, multiple layers are patterned by using a same mask, which saves masks and an etching process, thereby greatly improving the production efficiency and reducing the cost.

In some other embodiments of the present disclosure, the thin film encapsulation layer includes the second buffer layer, the atomic layer deposited layer and the first inorganic encapsulation layer, and does not include the organic encapsulation layer and the second inorganic encapsulation layer. In this case, finally, the second buffer preparation layer, the atomic layer deposition preparation layer and the first inorganic preparation layer can be simultaneously patterned by using the precursor protective layer 600" as a mask, and projections of the finally formed second buffer layer, atomic layer deposited layer and first inorganic encapsulation layer onto the substrate 100 have coincident edges.

Figure 20:
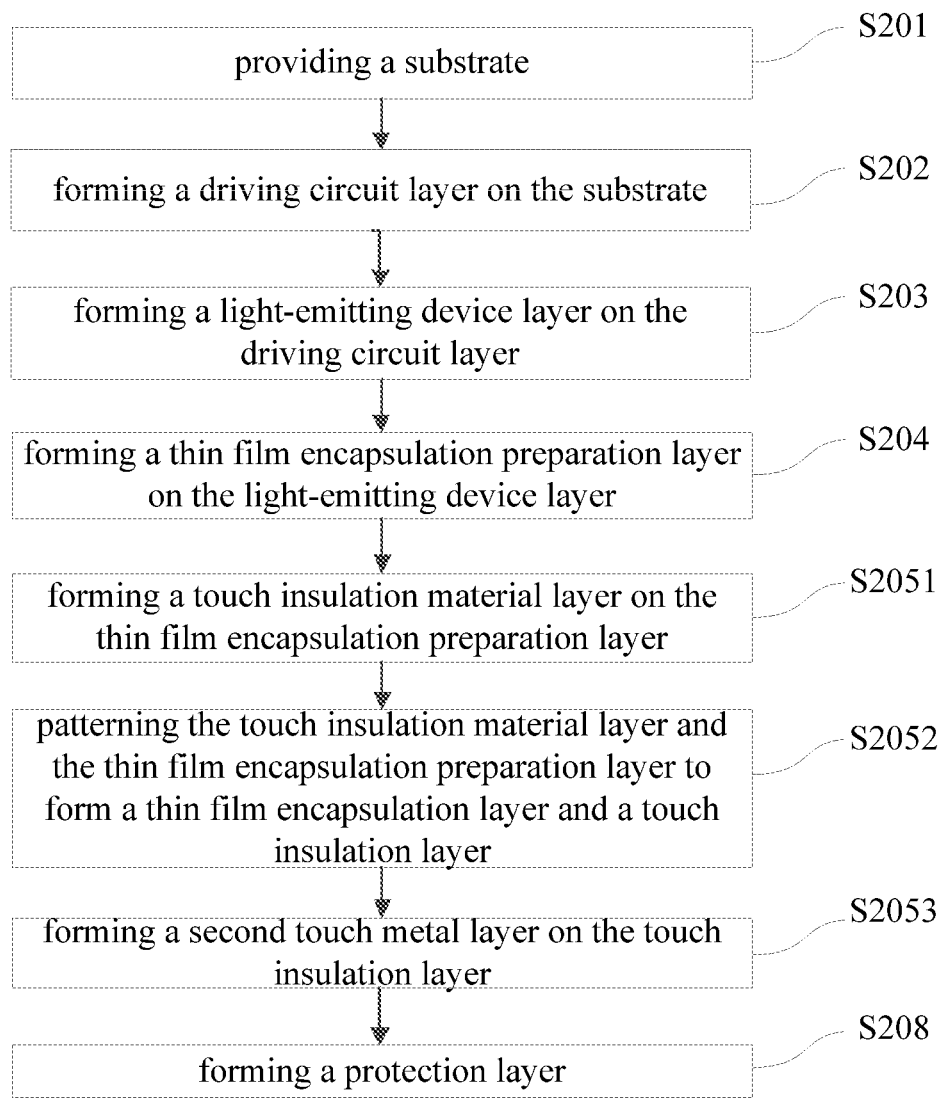
FIG. 20 is a schematic flowchart of a method for manufacturing another display device according to an embodiment of the present disclosure.

FIG. 20 is a schematic flowchart of a method for manufacturing another display device according to an embodiment of the present disclosure. As shown in FIG. 20, the method includes following steps.

At step S201, a substrate is provided;

At step S202, a driving circuit layer is formed on the substrate. The driving circuit layer includes a first metal layer, and the first metal layer includes pins located in the non-display area;

At step S203, a light-emitting device layer is formed on the driving circuit layer. The light-emitting device layer includes organic light-emitting diodes, each of which includes a first electrode, a light-emitting layer and a second electrode disposed on the driving circuit layer; and a pixel definition layer, including apertures exposing the first electrodes.

At step S204, a thin film encapsulation preparation layer is formed on the light-emitting device layer. In an embodiment of the present disclosure, the film encapsulation preparation layer includes a first inorganic preparation layer, an organic encapsulation layer and a second inorganic preparation layer that are stacked.

At step S2051, a touch insulation material layer is formed on the thin film encapsulation preparation layer. Before step S2051, the method further includes forming a first touch metal layer on the thin film encapsulation layer.

At step S2052, the touch insulation material layer and the thin film encapsulation preparation layer are patterned to form a thin film encapsulation layer and a touch insulation layer.

At step S2053, a second touch metal layer is formed on the touch insulation layer.

At step S208, a protective layer is formed.

In this embodiment, step S201 can be the same as step S101 in the other embodiment of the present disclosure, step S202 can be the same as step S102 in the other embodiment of the present disclosure, step S203 can be the same as step S103 in the other embodiment of the present disclosure, and step S204 can be the same as step S104 in the other embodiment of the present disclosure, and thus these steps will not be further described herein.

Figure 21:
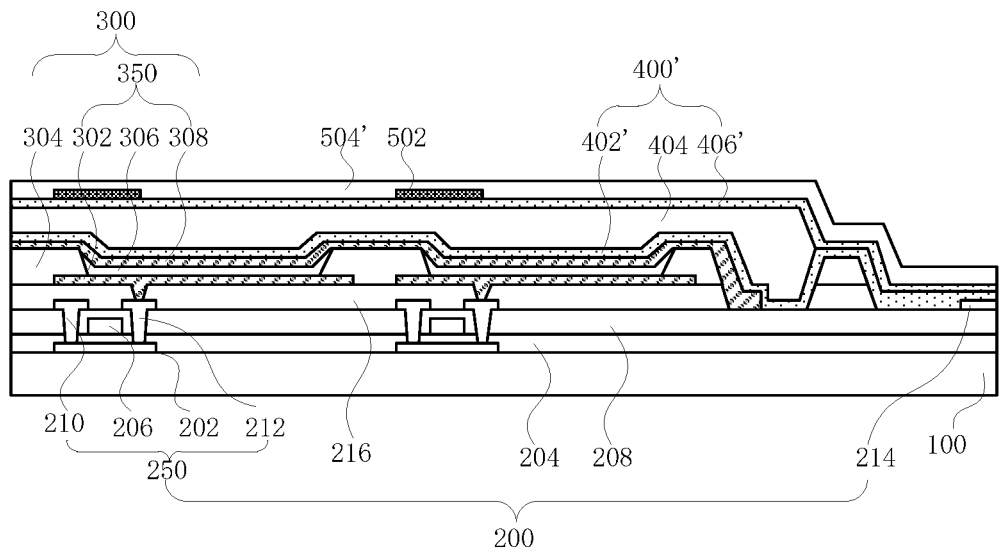
FIG. 21 is a cross-sectional view of a structure corresponding to step S2051 of FIG. 20.

FIG. 21 is a cross-sectional view of a structure corresponding to step S2051 of FIG. 20. With reference to FIG. 20 and FIG. 21, the touch insulation material layer 504' is formed on the thin film encapsulation preparation layer 400'. The touch insulation material layer 504' can be made of an inorganic material, including at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride. In some embodiments of the present disclosure, the touch sensing unit includes two metal layers. In this case, before forming the touch insulation material layer 504', the first touch metal layer 502 can be first formed on the thin film encapsulation preparation layer 400'. The method for forming the first touch metal layer 502 is the same as that in some other embodiments of the present disclosure, and details will not be further described herein. In some other embodiments of the present disclosure, the touch sensing unit can include only one metal layer, as shown in FIG. 11, in which the touch insulation material layer 504' can be formed directly on the thin film encapsulation preparation layer.

Figure 22:
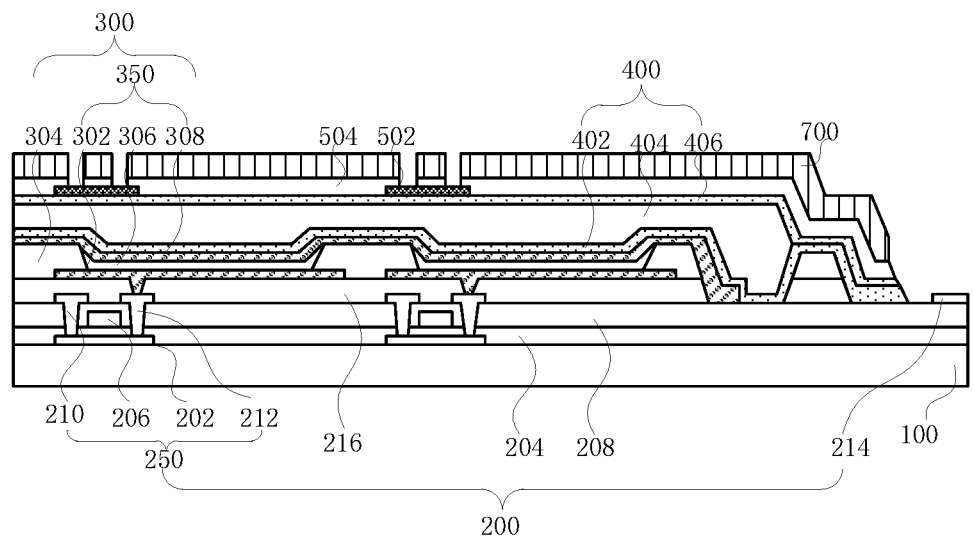
FIG. 22 is a cross-sectional view of a structure corresponding to step S2052 of FIG. 20.

FIG. 22 is a cross-sectional view of a structure corresponding to step S2052 of FIG. 20. With reference to FIG. 22 and FIG. 20, step S2052 is performed. First, the touch insulation material layer is coated with a photoetching material layer, and then the photoetching material layer is exposed and developed to form a photoresist 700 having a predetermined pattern. Then the touch insulation material layer is etched by using the patterned photoresist 700 as a mask so as to form the touch insulation layer 504. Simultaneously, the thin film encapsulation preparation layer is etched to form the thin film encapsulation layer 400. In this embodiment, the thin film encapsulation preparation layer includes a first inorganic preparation layer, an organic encapsulation layer 404, and a second inorganic preparation layer. In this case, the first inorganic preparation layer and the second inorganic preparation layer are etched by using the photoresist 700 as a mask so as to form a first inorganic encapsulation layer 402 and a second inorganic encapsulation layer 406.

In this embodiment, the first inorganic encapsulation layer 402 and the second inorganic encapsulation layer 406 are simultaneously patterned when the touch insulation layer 504 is being patterned to form the first through holes that expose a part of the first touch metal layer 502. The patterning process can be performed by applying a photoresist on the encapsulation insulation layer 504, performing exposure and development, and then performing dry etching. The encapsulation insulation layer 504 is always covered with the photoresist during the dry etching process, and therefore, in the non-display area NA, at the edge of the encapsulation insulation layer 504, the edge of the first inorganic encapsulation layer 402 and the edge of the second inorganic encapsulation layer 406, the three layers form a slope surface, i.e., the edges of the three insulation layers have same outlines and simultaneously expose the pins 214.

Figure 23:
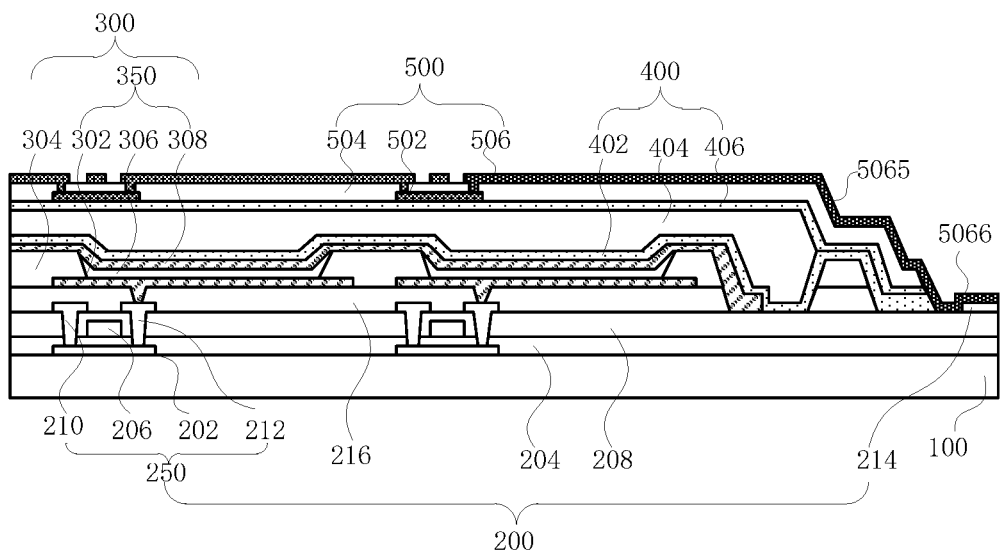
FIG. 23 is a cross-sectional view of a structure corresponding to step S2053 of FIG. 20.

FIG. 23 is a cross-sectional view of a structure corresponding to step S2053 of FIG. 20. With reference o FIG. 23 and FIG. 30, step S2053 is performed to form the second touch metal layer 506 on the touch insulation layer 504 after patterning.

In this embodiment, before forming the second touch metal layer 506, the touch insulation layer 504, the first inorganic encapsulation layer 402 and the second inorganic encapsulation layer 406 are patterned. Therefore, the touch pins 5066 included in the formed second touch metal layer 506 can be electrically connected to the pins 214, and are electrically connected to the first touch electrode blocks and the second touch electrode blocks by the first touch leading wires and the second touch leading wires 5065. In this way, the pins of both of the touch signal and the display signal are led out from the first metal layer located in the driving circuit layer, and finally only one flexible printed circuit board is used for common driving of the display and the touch.

With reference to FIG. 20 and FIG. 13, step S208 is performed to form the protective layer 600. The protective layer 600 is disposed on the touch sensing unit 500. In a process of forming the protective layer 600, a protective preparation layer can be first formed. The protective preparation layer can be formed by a low temperature chemical vapor deposition (LT-CVD) technique. The preparation layer can include an inorganic material or an organic material. Then, an edge of the patterned protective layer exposes the pins 214. The edge of the protective layer can be or cannot be coincident with an edge of the first inorganic encapsulation layer. After the protective layer 600 is patterned, the protective layer can be thinned by dry etching, thereby further improving bending resistance of the display device 10.

In the method for manufacturing the display device in this embodiment, when the touch insulation layer 504 is patterned to form the first through holes exposing a part of the first touch metal layer 502, the first inorganic encapsulation layer 402 and the second inorganic encapsulation layer 406 are simultaneously patterned. Therefore, compared with the related art in which multiple masks are used, this embodiment provides a simpler process. Moreover, in this embodiment, multiple insulation layers are thinned, thereby further improving the bending resistance.

In some other embodiments of the present disclosure, the thin film encapsulation layer can include only the second buffer layer, the atomic layer deposited layer and the first inorganic encapsulation layer, and does not include the organic encapsulation layer and the second inorganic encapsulation portion. In this case, the second buffer layer, the atomic layer deposited layer and the first inorganic encapsulation layer can be simultaneously patterned when the touch insulation layer 504 is being patterned, so as to expose the pins 214. The finally formed second buffer layer, atomic layer deposited layer, first inorganic encapsulation layer and touch insulation layer 504 have same outlines. Finally, the first touch leading wires and the second touch leading wires formed in the second touch metal layer 506 cross the second buffer layer. The slope at the edges of the atomic layer deposited layer, the first inorganic encapsulation layer and the touch insulation layer 504 are electrically connected to the touch pins 5066, and the touch pins 5066 are electrically connected to the pins 214.

The above description is a further detailed description of the present disclosure in connection with preferred embodiments and shall not be interpreted as providing limitations to implementing the present disclosure. Some simple derivations or substitutions can be made by those skilled in the art without departing from the concept of the present disclosure and shall fall into the protection scope of the present disclosure.

What is claimed is:

1. A display device, wherein display device has a display area and a non-display area, wherein the display device comprises:
    a substrate;
    a driving circuit layer arranged on the substrate, wherein the driving circuit layer comprises a first metal layer, wherein the first metal layer comprises pins located in the non-display area;
    a light-emitting device layer arranged on the driving circuit layer, wherein the light-emitting device layer comprises: organic light-emitting diodes, wherein each of the organic light-emitting diodes comprises a first electrode, a light-emitting layer and a second electrode that are disposed on the driving circuit layer, and a pixel definition layer comprising apertures exposing the first electrode;
    a thin film encapsulation layer arranged on the light-emitting device layer and comprising a first inorganic encapsulation layer;
    a touch sensing unit arranged on the thin film encapsulation layer and comprising: a touch insulation layer and a second touch metal layer; and
    a protective layer arranged on the touch sensing unit;
    wherein a projection of the first inorganic encapsulation layer onto the substrate and a projection of the protective layer onto the substrate have coincident edges and do not overlap with the pins; or the projection of the first inorganic encapsulation layer onto the substrate and a projection of the touch insulation layer onto the substrate have same outlines and do not overlap with the pins;
    wherein a thickness of the protective layer increases from an edge area to a central area; and
    wherein the protective layer comprises a slope portion having a length L1 and a maximum height H1, where $300 \leq L1/H1 \leq 600$.

2. The display device according to claim 1, wherein the thin film encapsulation layer further comprises an organic encapsulation layer and a second inorganic encapsulation layer, wherein the first inorganic encapsulation layer, the organic encapsulation layer, and the second inorganic encapsulation layer are sequentially stacked;
    wherein the projection of the first inorganic encapsulation layer onto the substrate, a projection of the second inorganic encapsulation layer onto the substrate and the projection of the protective layer onto the substrate have coincident edges and do not overlap with the pins; or
    wherein the projection of the first inorganic encapsulation layer onto the substrate, the projection of the second inorganic encapsulation layer onto the substrate, and the projection of the touch insulation layer onto the substrate have same outlines and do not overlap with the pins.

3. The display device according to claim 1, wherein the thin film encapsulation layer further comprises a second buffer layer and a thin film, wherein the thin film is deposited by ALD (atomic layer deposition), and wherein the second buffer layer, the thin film, and the first inorganic encapsulation layer are sequentially stacked; wherein a projection of the second buffer layer onto the substrate, a projection of the thin film onto the substrate, and the projection of the first inorganic encapsulation layer onto the substrate have coincident edges and do not overlap with the pins; or
    wherein the projection of the second buffer layer onto the substrate, the projection of the thin film onto the substrate, the projection of the first inorganic encapsulation layer onto the substrate, and the projection of the touch insulation layer onto the substrate have same outlines and do not overlap the pins.

4. The display device according to claim 1, wherein the protective layer is made of an inorganic material.

5. The display device according to claim 1, wherein the touch sensing unit further comprises a first touch metal layer, the first touch metal layer comprising a plurality of first connection portions; wherein the touch insulation layer comprises first through holes that expose a part of the plurality of first connection portions;
    wherein the second touch metal layer comprises a plurality of first touch electrode blocks, a plurality of second touch electrode blocks, and a plurality of second connection portions; wherein adjacent first touch electrode blocks of the plurality of first touch electrode blocks in a first direction are electrically connected through one of the plurality of first connection portions to form a first touch electrode, and wherein adjacent second touch electrode blocks of the plurality of second touch electrode blocks in a second direction are electrically connected through one of the plurality of second connection portions to form a second touch electrode.

6. The display device according to claim 5, wherein the plurality of first electrode blocks is grid-shaped, and the plurality of second electrode blocks is grid-shaped; and wherein the touch insulation layer is provided with recesses for receiving the plurality of first electrode blocks and the plurality of second electrode blocks.

7. The display device according to claim 6, wherein each of the recesses is an arc-shaped recess, an upper surface of each of the plurality of first electrode blocks and an upper surface of each of the plurality of second electrode blocks are flush with an upper surface of the touch insulation layer between adjacent recesses.

8. The display device according to claim 6, wherein the recesses penetrate through the touch insulation layer.

9. The display device according to claim 1, wherein the second touch metal layer comprises touch pins, and wherein the touch pins are electrically connected to the pins.

10. A method for manufacturing a display device, wherein the display device comprises a display area and a non-display area, wherein the method comprises:
    providing a substrate;
    forming a driving circuit layer on the substrate, wherein the driving circuit layer and the first metal layer comprise a first metal layer comprising pins disposed in the non-display area;
    forming a light-emitting device layer on the driving circuit layer, wherein the light-emitting device layer comprises: organic light-emitting diodes, wherein each of the organic light-emitting diodes comprises a first electrode, a light-emitting layer and a second electrode that are disposed on the driving circuit layer, and an electrode definition layer comprising apertures exposing the first electrode;

forming a thin film encapsulation preparation layer on the light-emitting device layer, wherein the thin film encapsulation preparation layer comprises a first inorganic preparation layer;

forming a touch sensing unit on the thin film encapsulation preparation layer, wherein the touch sensing unit comprises a first touch metal layer, a touch insulation layer, and a second touch metal layer;

forming a protective preparation layer on the touch sensing unit;

patterning the protective preparation layer to form a precursor protective layer; and patterning the first inorganic preparation layer by using the precursor protective layer as a mask to form a first inorganic encapsulation layer and a protective layer;

wherein a projection of the first inorganic encapsulation layer onto the substrate and a projection of the protective layer onto the substrate have coincident edges and do not overlap with the pins;

wherein a thickness of the protective layer increases from an edge area to a central area; and wherein the protective layer comprises a slope portion having a length L1 and a maximum height H1, where $300 \leq L1/H1 \leq 600$.

11. The method according to claim 10, wherein said forming the thin film encapsulation preparation layer on the light-emitting device layer comprises:

forming a first inorganic encapsulation material layer; and thinning the first inorganic encapsulation material layer to form the first inorganic preparation layer.

12. The method according to claim 11, further comprising forming an organic encapsulation layer and a second inorganic preparation layer on the first inorganic preparation layer.

13. The method according to claim 10, wherein said forming the thin film encapsulation preparation layer on the light-emitting device layer comprises:

forming a second buffer preparation layer;

forming an atomic layer deposition preparation layer; and forming the first inorganic preparation layer.

14. The method according to claim 10, further comprising: thinning the protective preparation layer to form the protective layer after patterning the protective preparation layer.

15. A method for manufacturing a display device, wherein the display device comprises a display area and a non-display area, the method comprising:

providing a substrate;

forming a driving circuit layer on the substrate, wherein the driving circuit layer comprises a first metal layer, wherein the first metal layer comprises pins located in the non-display area;

forming a light-emitting device layer on the driving circuit layer, wherein the light-emitting device layer comprises: organic light-emitting diodes, wherein each of the organic light-emitting diodes comprises a first electrode, a light-emitting layer, and a second electrode that are disposed on the driving circuit layer, and an electrode definition layer comprising apertures exposing the first electrodes;

forming a thin film encapsulation preparation layer on the light-emitting device layer, wherein the thin film encapsulation layer preparation comprises a first inorganic preparation layer;

forming a touch insulation preparation layer on the thin film encapsulation preparation layer;

patterning the touch insulation preparation layer to form a touch insulation layer;

patterning the first inorganic preparation layer to form a first inorganic encapsulation layer;

forming a second touch metal layer on the touch insulation layer; and forming a protective layer on the second touch metal layer;

wherein a projection of the first inorganic encapsulation layer onto the substrate and a projection of the touch insulation layer onto the substrate have same outlines and do not overlap with the pins;

wherein a thickness of the protective layer increases from an edge area to a central area; and wherein the protective layer comprises a slope portion having a length L1 and a maximum height H1, where $300 \leq L1/H1 \leq 600$.

* * * * *